United States Patent [19]

Kramer et al.

[11] Patent Number: 5,452,238

[45] Date of Patent: * Sep. 19, 1995

[54] METHOD FOR SOLVING GEOMETRIC CONSTRAINT SYSTEMS

[75] Inventors: Glenn A. Kramer; Walid T. Keyrouz; Jahir A. Pabon, all of Austin, Tex.

[73] Assignee: Schlumberger Technology Corporation, Austin, Tex.

[*] Notice: The portion of the term of this patent subsequent to Aug. 27, 2008 has been disclaimed.

[21] Appl. No.: 979,143

[22] Filed: Nov. 20, 1992

Related U.S. Application Data

[63] Continuation-in-part of Ser. No. 365,586, Jun. 13, 1989, Pat. No. 5,253,189.

[51] Int. Cl.⁶ .......................................... G06F 15/20
[52] U.S. Cl. ................................. 364/578; 364/512; 364/550; 364/815; 364/820; 395/119; 395/143; 395/121
[58] Field of Search .............. 364/578, 512, 550, 815, 364/820; 395/119, 121, 143

[56] References Cited

U.S. PATENT DOCUMENTS

| | | |
|---|---|---|
| 4,736,206 | 4/1988 | Christensen et al. . |
| 4,757,461 | 7/1988 | Stohr et al. . |
| 4,791,579 | 12/1988 | Kranitzky . |
| 4,831,546 | 5/1989 | Mitsuta et al. . |
| 4,831,548 | 5/1989 | Matoba et al. . |
| 4,835,709 | 5/1989 | Tsai et al. . |
| 4,855,939 | 8/1989 | Fitzgerald, Jr. et al. . |
| 4,858,146 | 8/1989 | Shebini ........................... 364/578 |
| 4,866,663 | 9/1989 | Griffin . |
| 4,868,766 | 9/1989 | Oosterholt . |
| 4,912,657 | 3/1990 | Saxton et al. . |
| 4,928,233 | 5/1990 | Millis . |
| 4,965,740 | 10/1990 | Schofield et al. . |
| 5,043,929 | 8/1991 | Kramer et al. ..................... 364/578 |
| 5,253,189 | 10/1993 | Kramer ............................ 364/578 |
| 5,297,057 | 3/1994 | Kramer et al. ..................... 364/512 |

FOREIGN PATENT DOCUMENTS

161964  11/1985  European Pat. Off. .

OTHER PUBLICATIONS

Orlandea et al., *J. of Eng. for Industry* (1977 99:780–784.
Shigley et al., *Theory of Machines and Mechanisms*, Chapter 5, pp. 169–192, McGraw-Hill Book Company, 1980.

(List continued on next page.)

*Primary Examiner*—Emanuel T. Voeltz
*Assistant Examiner*—Alan Tran
*Attorney, Agent, or Firm*—Charles D. Huston

[57] ABSTRACT

A method, useful in computer-aided design, for finding possible configurations of a system having a collection of geometric entities and constraints. The method represents the geometric entities in terms of degrees of freedom and systematically satisfies the constraints reducing the degrees of freedom of the geometric entities. The method uses a number of specialized routines, called plan fragments, which satisfy a particular constraint relating to a particular geometric entity. Each plan fragment changes the configuration of a geometric entity in space—i.e. the location and orientation—satisfying a constraint and reducing a degree of freedom. The series of plan fragments which reduce the degrees of freedom and satisfy the constraints comprise an assembly plan for possible configurations of the system. The method identifies overconstrained, fully constrained, and underconstrained systems to the user and assists in finding possible configurations if the constraints are changed, added, or deleted. The method is useful in solving any geometric constraint problem, such as describing mechanical assemblies constraint-based sketching and design, geometric modeling for CAD, and kinematic analysis of robots and linkage mechanisms. By reasoning symbolically about the geometry of the system, the method provides faster solutions, numerical stability, user feedback, and the ability to handle redundant constraints.

25 Claims, 16 Drawing Sheets

OTHER PUBLICATIONS

Erdman et al., *Mechanism Design: Analysis and Synthesis*, Chapter 8, pp. 391–478, Prentice Hall, Englewood Cliffs, N.J., 1984.

Artobolevsky, *Mechanisms in Modern Engineering Design;* originally published as *Manual of Mechanisms,* USSR Academy of Sciences, 1947–52; translated and reprinted, Mir Publishers, Moscow, 1975.

Cagan and Agogino "Innovative Design of Mechanical Structures from First Principles," to appear in AI EDAM, 1988.

Hall, *Kinematics and Linkage Design*, (1961) Chapter 7, pp. 111–153.

Hrones and Nelson, *Analysis of the Four-Bar Linkage*, the Technology Press of MIT and John Wiley & sons, Inc., New York, 1951.

Kowalski, "The VLSI Design Automation Assistant: A Knowledge-Based Expert System," Thesis, Dept. of Electrical and Computer Engineering, Carnegie-Mellon University, Apr. 1984.

Mead and Conway, *Introduction to VLSI Systems*, Addison-Wesley, Ready, Mass., 1980.

Roylance, "A Simple Model of Circuit Design," MIT Artificial Intelligence Lab Memo AI-TR-703, 1983.

Turner and Bodner, "OPtimization and Synthesis for Mechanism Design," *Proc. of Autofact-88*, Detroit, Oct. 1988.

Press et al., *Numerical Receipes: The Art of Scientific Computing*, Cambridge University Press, 1986.

Sutherland, "Sketchpad: A Man-Machine Graphical Communication System," Ph. D. Thesis, MIT, Cambridge, Mass., 1963.

Borning, "ThingLab—A Constraint-Oriented Simulation Laboratory," Ph. D. Thesis, Sanford University, Stanford, Calif. Jul. 1979.

Steele, Jr., "The Definition and Implementation of A Programming Language Based on Constraints," Ph. D. Thesis, MIT, Cambridge, Mass., 1980.

Gelernter, *Computers and Thought*, Feigenbaum and Feldman, eds., pp. 134–152, McGraw Hill, New York, N.Y., 1963.

Johnson, "Optimal Linkage Synthesis: Design of a Constant Velocity, Straight Line Motion Scanning Mechanism," Masters Thesis, University of California, Berkeley, Calif., 1985.

Kota et al., *Mechanical Engineering* (1987) pp. 34–38.

Turner, "BravoMOST: Optimal Synthesis for Mechanism Design,", May 10, 1989.

Bobrow, "Qualitative Reasoning about Physical Systems: An Introduction," *Artificial Intelligence* vol. 24, Nos. 1–3, 1984, pp. 1–5.

DeKleer et al., "A Qualitative Physics Based on Confluences," *Artificial Intelligence*, vol. 24, Nos. 1–3, 1984, pp. 7–83.

Bravo Most Advertising Brochure.

Okino et al.; "Robot Simulator in TIPS/Geometric Simulator, Robotics & Computer-Integrated Manufacturing"; vol. 3, Nov. 4, pp. 429–437, 1987.

Gelsey et al.; "Automated Reasoning About Machine Geometry and Kinematics"; Proc. at the 3rd Conf. on Artificial Intelligence Applications, Feb. 1987, pp. 182–187.

Heginbotham et al., "Rapid Assessment of Industrial Robots Performance by Interactive Computer Graphics," *9th International Symposium on Industrial Robots*, Washington, D.C., Mar. 13–15, 1979, pp. 563–574.

Meyer, "An Emulation System for Programmagle Sensory Robots," *IBM J. Res. Develop.* (1981) 25:955–961.

Levary et al., "Hybrid Expert Simulation System (HESS)," *Expert Systems* (1988) 5:120–129.

Thoreson et al., "Designing Mechanisms for Production Equipment," *Machine Design* (1988) 60:113–117.

Karmarkar et al., "Power Series Variants of Karmarker-Type Algorithms," *AT&T Technical Journal* (1989) 68:20–36.

Thoreson et al., "Designing Mechanisms for Production Equipment," *Machine Design* (1988) 60:113–117.

Karmarkar et al., "Power Series Variants of Karmarker-Type Algorithms," *AT&T Technical Journal* (1989) 68:20–36.

METHOD FOR SOLVING GEOMETRIC CONSTRAINT SYSTEMS

This application is a continuation-in-part of U.S. patent application No. 07/365,586 filed Jun. 13, 1989, now U.S. Pat. No. 5,253,189.

FIELD OF THE INVENTION

The present invention relates to a method for finding the possible configurations of the geometric system having a collection of geometric entities that satisfy a set of geometric constraints, and is particularly useful in computer-aided design (CAD). In particular, the invention relates to a method that solves the geometric constraint satisfaction problem by representing the geometric entities in terms of degrees of freedom and builds an assembly plan for determining possible configurations of the system.

BACKGROUND OF THE INVENTION

A computer-aided design (CAD) system should account for the dynamic nature of the design process, enabling design modifications while recognizing critical design constraints which should not change. In the past, it was necessary for the CAD engineer to remember the design constraints and relationships and consciously preserve them every time a change is made to the design, increasing both design time and the possibility of error. Maintaining design constraints and relationships is particularly difficult through multiple design changes, particularly with complex parts. Compounding the problem is the fact that even simple designs include hundreds of constraints and all of the design constraints may not be known when a modification is made or attempted. Ideally, a CAD system would allow the engineer to make a design change while maintaining critical constraints, would identify conflicts among the constraints, and possible solutions where the design is overconstrained.

Many design problems can be generally described as a geometric constraint satisfaction problem. That is, given a collection of geometric entities and constraints that describe how the geometric entities interact with each other, find their positions, orientations, and dimensions (i.e., "configuration") so as to satisfy all constraints simultaneously. Solving such geometric constraint satisfaction problems is central to several related domains: describing mechanical assemblies, constraint-based sketching and design, geometric modeling for CAD, and kinematic analysis of robots and other mechanisms. U.S. patent application Nos. 07/365,586; 07/675,592; and U.S. Pat. No. 5,043,929 (incorporated by reference) relate to techniques for solving certain aspects of geometric constraint satisfaction problems.

Known general-purpose constraint satisfaction techniques are not well suited to the solution of constraint problems involving complicated geometry. Existing techniques represent geometric entities and constraints as algebraic equations, whose real solutions yield the numerical values describing the positions, orientations, and dimensions of the geometric entities. Such equation sets are highly nonlinear and highly coupled, and in the general case require iterative numerical solution techniques. Iterative numerical programs are not particularly efficient, and can have problems with stability and robustness. See, William H. Press, Brian P. Flannery, Saul A. Teukolsky, and William T. Vetterling. *Numerical Recipes: The Art of Scientific Computing*. Cambridge University Press, Cambridge, UK, 1986. For many tasks (e.g., simulation and optimization of mechanical devices) the same equations are solved repeatedly, which makes a "hard-wired," or compiled, solution desirable.

In theory, symbolic analysis of such complex algebraic equations can often yield a non-iterative, closed-form solution, or can help reduce the number of redundant generalized coordinates in an iterative problem. Once found and compiled, such a closed-form solution may be executed in time nearly linearly proportional to the size of the constraint problem. However, the computational instability and intractability of symbolic algebraic solution of the equations renders this approach impractical. See, Yanxi Liu and Robin J. Poppiestone, Symmetry Constraint Inference in Assembly Planning: Automatic assembly configuration specification. *In Proceedings of the National Conference on Artificial Intelligence*, pages 1038–1044, Boston, Mass., 1990.

Numerical analysis of these complex algebraic equations include two approaches: "Propagational" and "Variational." Propagational methods are widely used commercially and are commonly known as "parametric." In a propagational method, each geometric entity that makes up a model is placed relative to an entity that was defined before it. Numeric propagational systems keep track of the sequence of geometric entities and their corresponding equations. When modifications are made to the design, the system works its way along a propagational chain to redefine the geometry according to the changes the user has made. This is similar to what happens when a change is made to a cell in a computerized spreadsheet; the modifications are propagated from column to column throughout the rest of the spreadsheet. Propagational methods can be direct and fast, but they have difficulty reconciling simultaneous equations.

Numeric "Variational" methods have also had commercial success. In variational methods, the system asks the user to specify the geometry and the relationships among entities. The system then solves the constraints numerically, using conventional iterative techniques. Variational systems are able to handle a wide range of constraints, including simultaneous equations, but generally speaking, their performance is much slower than propagational methods, and stability and convergence problems often make results unpredictable.

Since such conventional analysis methods take what is essentially geometry and couch it in terms of equations, systems based on these methods cannot truly understand how geometry behaves. Therefore, systems using these methods have difficulty preserving the user's design intent consistently, reliably, and quickly.

Another problem with conventional approaches is deriving a representation of the geometry of the system allowing closed-form solution which facilitates design and analysis. While some problems such as finite element analysis and design using deformable surfaces are inherently iterative in nature, other problems can, in principle, be treated either entirely or in large part using closed-form solution techniques. See, George Celniker and David Gossard, Deformable Curve and Surface Finite-Elements for Free-Form Shape Design, *Computer Graphics*, 25(4):257–266, July 1991 and Richard H. Gallagher. *Finite Element Analysis: Fundamentals*. Prentice-Hall, Inc., Englewood Cliffs, N.J., 1975. In practice, problems amenable to closed-form solution are still treated iteratively, either due to the complexity of deriving a direct formulation, or due to the use of more general solution techniques that also handle the (possibly small) portions of the problem which require iteration.

Domains such as constraint-based sketching and mechanical part design are amenable to closed-form solution. They tend to rely on complex combinations of relative simple geometric entities, such as points, lines, and circles, and a small collection of constraints such as coincidence, tangency, and parallelity. For example, profile design for mechanical devices involves defining a closed perimeter curve, usually comprised of line segments and arcs, with a set of features, such as holes and slots, in the interior. In three dimensions, collections of simple solids (e.g., spheres, cones, cylinders) are combined to yield a solid structure. While the positions of the geometric entities in such structures often may be computed in a closed-form, analytic manner, the sequence of transformational operations required to satisfy the constraints may be quite complex. In the past, the designer of the part had to provide the transformation sequences. See, J. R. Rossignac, Constraints In Constructive Solid Geometry, *In Proceedings of the 1986 Workshop on Interactive 3D Graphics*, pages 93-110. ACM Press, 1986.

Texts in fields such as mechanical engineering or computer-aided design employ simple examples using algebraic techniques inspired by, and grounded in, the geometric nature of the problems being analyzed. Kinematic analysis of rigid-body mechanisms is an example in which geometric construction techniques are used. See, R. S. Hartenberg and J. Denavit. *Kinematic Synthesis of Linkages.* McGraw Hill, New York, 1964. However, real-world codes for kinematic analysis bear no resemblance to the human problem-solving techniques outlined in such texts, and are quite unintuitive.

The nonpatent references cited above are incorporated by reference for background.

U.S. patent application No. 07/365,586 and U.S. Pat. No. 5,043,959 introduced the concept of reasoning symbolically about geometric entities and constraints using a "degrees of freedom" approach. The present invention reflects a refinement and extension of this approach.

SUMMARY OF THE INVENTION

The problems of current computer-aided design systems and methods for solving geometric constraint satisfaction problems are largely solved by the system and method of the present invention. The method of the present invention reasons symbolically about the geometry of a system using a degrees of freedom approach providing faster solutions, numerical stability, user feedback, and the ability to handle redundant constraints. In many cases a closed-form solution is obtained, permitting compilation and efficient reuse. This method of geometric symbolic reasoning permits the user to interactively change, add, or delete, design constraints or similarly vary geometric entities in complex geometric constraint satisfaction problems.

Broadly speaking, the method of the present invention represents the geometric entities in a system in terms of degrees of freedom, builds an assembly plan, and determines the possible configurations of the geometric entities in the systems using the assembly plan. The assembly plan is built using a plurality of plan fragments which incrementally transform geometric entities to satisfy constraints and systematically reduce the degrees of freedom of the system. That is, a first plan fragment transforms a first geometric entity to a first configuration satisfying a particular constraint and correspondingly reducing one or more degrees of freedom. Plan fragments are used for transforming other geometric entities, satisfying constraints in the system until all or most of the constraints of the system are satisfied.

If the system is fully constrained, but not overconstrained, the constraints are fully satisfied and the degrees of freedom of the system are reduced to zero, permitting identification of a configuration of the geometric entities in the system. If the system is underconstrained, or no closed-form solution exists, the method suggests redundant default constraints and using iterative solution techniques suggests possible configurations of the system.

To reason symbolically about the geometry of the system, the method represents the geometric entities in terms of degrees of freedom. In a preferred form, the representation comprises a data structure having a plurality of invariants. In another form, the geometric entities are parameterized by a set of configuration variables—preferably three translational degrees of freedom and three rotational degrees of freedom.

BRIEF DESCRIPTION OF THE DRAWINGS

FIG. 7 illustrates another example of a geometric constraint satisfaction problem where the geometric entities interact with each other, where—

FIG. 9 illustrates the graphical depiction of a solution for the ten-bar linkage mechanism of FIG. 8, where—

FIG. 10 illustrates the use of locus propagation, where—

DESCRIPTION OF PREFERRED EMBODIMENTS

1 Overview

Figure 1:
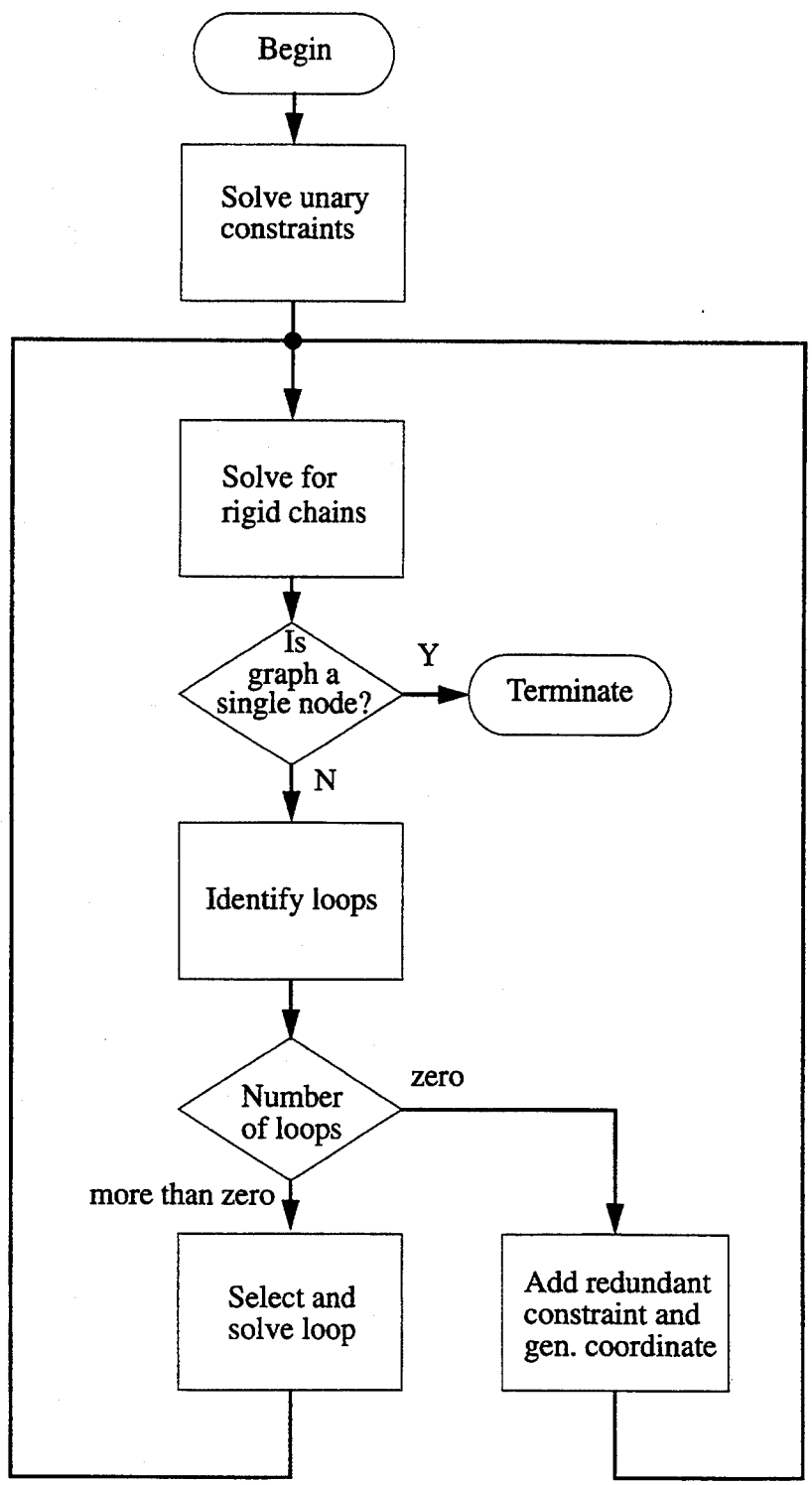
FIG. 1 is a flow chart providing an overview of the method of the present invention for determining possible configurations of a geometric constraint system.

Degrees of freedom analysis solves geometric constraint satisfaction problems by reasoning symbolically about geometry, rather than equations, leading to more efficient solution techniques. Degrees of freedom analysis uses two models of a constraint problem: a symbolic geometric model, and a detailed numerical model. The geometric model is used to reason symbolically about how to assemble the geometric entities so as to satisfy the constraints incrementally. The "assembly plan" or "assembly procedure" thus developed is then used to guide the solution of the complex nonlinear equations—derived from the numerical model—in a highly decoupled, stylized manner. This approach allows finding non-iterative, closed-form solutions whenever possible, and allows formulating iterative problems with a minimal number of redundant generalized coordinates when closed-form solutions do not exist.

2 Terminology

The objects of interest in solving geometric constraint satisfaction problems are called "geometric entities" or "geoms." Some examples of geometric entities are lines, line segments, circles, and rigid bodies. Geometric entities have degrees of freedom, which allow them to vary in location or size. For example, in 3D space, a rigid body has three translational and three rotational degrees of freedom. A circle with a variable radius has three translational, two rotational, and one dimensional degree of freedom (a third rotational degree of freedom is not required because the circle is invariant under rotation about its axis). Thus, the "configuration" of a geometric entity is its position, orientation, and dimension in space.

The "configuration variables" of a geometric entity are defined as the minimal number of real-valued parameters or "generalized coordinates" required to specify the geometric entity in space unambiguously. The configuration variables parameterize a geometric entity's translational, rotational, and dimensional degrees of freedom, with one variable required for each degree of freedom. Movement of a geometric entity in space is "transformation."

Using this terminology, the geometric constraint satisfaction problem may be expressed as follows: Given a set of geometric entities and constraints between them, find the configurations of the geometric entities such that all constraints are satisfied. The collection of entities and constraints is called the "constraint system," or simply the "system".

In this application the method of the present invention is sometimes referred to as "degrees of freedom analysis." The term "action analysis" refers to the process for finding and solving constraints related to a geometric entity. "Locus analysis" is a process for reducing problems having a number of bodies or geometric entities to a single body.

3 Degrees of Freedom Analysis

The earliest analyses of mechanisms were entirely graphical (i.e., geometrical) in nature and similar to degrees of freedom analysis. As algebraic methods were developed, the graphical methods were abandoned due to the error inherent in such manual approaches. But the algebraic techniques are hardly intuitive; therefore, the graphical methods are still significant. Graphical methods maintain touch with physical reality to a much greater degree than do the algebraic methods and serve as useful guides in directing the course of equation solution. Degrees of freedom analysis encapsulates this "intuition" in a formal method.

One way to characterize degrees of freedom analysis is as a forward chaining system performing geometric constructions to ascertain the location of the various changes to geometric entities. In geometry theorem proving, forward chaining is infeasible because the space of possible inference is infinite. In degrees of freedom analysis, each geometric construction (comprised of a sequence of measurements and actions) satisfies some constraint, but also reduces the number of degrees of freedom in the composite system of geometric entities. Eventually, all degrees of freedom are consumed by actions, and the inference process terminates. Thus, forward chaining is feasible.

Solving using degrees of freedom analysis relies on a shift from reasoning about real-valued configuration variables to reasoning about the degrees of freedom of the actual geometric entities. The equations that relate configuration variables to each other may be complicated, tightly coupled, and highly nonlinear; in addition, the domains of the configuration variables are continuous, yielding an infinite search space. In contrast, a geometric entity's degrees of freedom form a compact, discrete-valued description of the state of the geometric entity.

Figure 5:
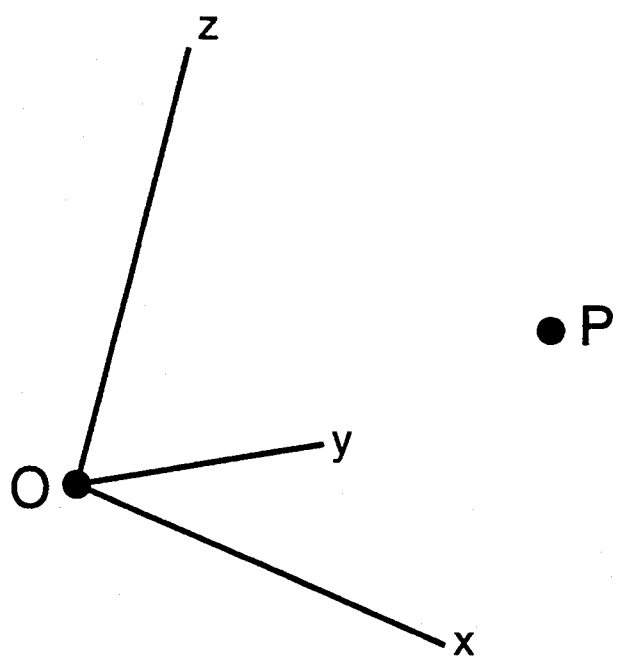
FIG. 5 schematically depicts a local coordinate frame which may be represented by six configuration variables.

Degrees of freedom analysis forms abstract equivalence classes describing the state of a geometric entity without specifying how the constraints that lead to that state are satisfied. Degrees of freedom may be considered resources which are consumed by "physically" moving geometric entities to satisfy constraints. Further actions are then confined to those that do not violate any previously-satisfied constraints. Therefore, every constraint, upon being satisfied, requires that certain quantities be treated as invariant in the satisfaction of subsequent constraints, thereby restricting some number of degrees of freedom. These geometric invariants are represented explicitly. Reasoning about degrees of freedom is essential to decoupling the constraints. Consider the xyz coordinate frame in FIG. 5, with point O at the origin, and point P at some arbitrary location, both points rigidly fixed in the coordinate frame. As a rigid body, the coordinate frame is parameterized by six configuration variables, three for the translational degrees of freedom (x, y, z), and three for the rotational degrees of freedom ($\theta$, $\phi$, $\psi$). In this example, the rotational degrees of freedom are represented using Euler angles. Thus, the coordinate frame is free to translate and rotate in space, i.e., to be "transformed."

Fixing the position of either point O or P (through the satisfaction of some constraint) removes the three translational degrees of freedom in the system; the coordinate frame may only rotate about the fixed point in order to satisfy subsequent constraints. But consider the constraints in terms of configuration variables. Fixing the position of point O uniquely determines the three translational coordinates:

$x = x_O$
$y = y_O$
$z = z_O$ where $[x_O, y_O, z_O]$ denotes the position of point O in the global reference frame.

In contrast, fixing the position of P (instead of O) introduces nonlinear constraint equations into the system to relate the configuration variables to the distance $\overline{OP}$:

$$(x-x_p)^2+(y-y_p)^2+(z-z_p)^2=\overline{OP}^2$$

$$\tan\theta=(y-y_p)/(x-x_p)$$

$$\tan\phi=[(y-y_p)/(z-z_p)]\csc\theta$$

Solving constraint systems algebraically is difficult because of this type of coupling between configuration variables. The coupling is entirely an artifact of the way in which the system is modeled; for example, if the same rigid body is modeled with the coordinate frame centered at point P, then satisfying a constraint involving point O leads to coupled equations.

Using incremental movement as a constraint satisfaction scheme, the constraint that point O of the body be at a specific point in space is satisfied by measuring the vector from O to that point, and translating the body by that vector. There is no need to use the local coordinate frame representation, as long as the global position of O can be found by some means. Thus, the identical solution strategy works for point P.

Solving in degrees of freedom space is simpler because the actions can be specified independently of how the system is parameterized in terms of configuration variables. The action of translating a geom to bring a specific point (O or P) to a particular location is independent of the detailed mathematical representation of the geom. The operational semantics shields a constraint satisfaction algorithm from having to know anything about "arbitrary" internal representations.

Degrees of freedom analysis employs the notion of incremental assembly as a metaphor for solving geometric constraint systems. This use of assembly should not be confused with physical interpretations of assembly as in, for example, robotics applications. In a metaphorical assembly, no physical meaning is ascribed to how the objects move from where they are to where they need to be, a factor which is quite important in a real assembly problem. In solving geometric satisfaction problems the values of the configuration variables constitute the desired answer, rather than the history of how they were calculated.

In a metaphorical assembly, geometric entities are treated as "ghost objects" which can pass through each other. It is therefore possible to ignore the physical constraints imposed by the boundaries of physical bodies, and instead be concerned only with purely geometric relations. The constraints between "ghost" geometric entities may be satisfied incrementally; no part is ever moved in a way which violates previously satisfied constraints In some real-world problems, like kinematic analysis or profile sketching in CAD, the starting locations of the geometric entities and their movement toward a configuration which satisfies the constraints is of no concern. What is desired is the globally consistent locations of the geometric entities. In other domains, such as "real" assembly planning, the "ghost object" metaphor is clearly incorrect. However, real assembly planning can benefit from knowing the final locations of the assembled objects. Disassembling the collection of assembled objects is an easier problem than generating a physically-realizable assembly plan; the disassembly plan can then be run in reverse to create an assembly plan which takes into account the physical constraints.

A "plan" (a sequence of measurements and actions) for moving a set of "ghost" geometric entities from arbitrary configurations to ones satisfying the constraints is called an assembly plan, or assembly procedure. The generation of an assembly plan is a problem in symbolic geometry. The sequence of measurements and actions is determined without regard to the actual metric values of the parts. However, geometric degeneracies must be accommodated. The assembly plan describes the general form of a solution to a constraint problem. However, symbolic geometry alone is not sufficient to obtain the real values of the configuration variables describing each in a system.

To obtain values for configuration variables, degrees of freedom analysis requires a detailed numerical model of each geom. Relating the numerical model to the symbolic model requires a set of operators for translating, rotating, and scaling geometric entities, and a set of functions that can measure, relative to a global coordinate system, points and vectors embedded in any geom. These capabilities are provided by homogeneous coordinate transforms which most graphics and robotics systems use. The use of the operators allows the solution to the constraint problem to be found in a manner that is independent of the way in which the system is modeled at the detailed numerical level.

4 Representation

Geometric entities can be nested hierarchically in a part-whole relationship; the terms "subgeom" and "parent geom" are sometimes used to denote relative position in the hierarchy. Aggregate geometric entities are composed of combinations of primitive—points, vectors and dimensions. A set of measurement, or query, operators allow finding the positions and orientations of points and vectors in the global, or world, coordinate frame.

With the exception of dimensional constraints, all constraints considered here are binary constraints they relate two geometric entities. These constraints may additionally involve real parameters. Some examples of binary constraints used in this paper are shown in Table 1. Dimensional constraints are unary; they relate one geometric entity to a real-valued dimension parameter.

TABLE 1

| Examples of constraints | |
|---|---|
| Constraint name | Explanation |
| dist:point-point ($G_1$, $G_2$, d) | Distance between point $G_1$ and point $G_2$ is d |
| dist:point-line ($G_{pt}$, $G_1$, d) | Distance between point $G_{pt}$ and line $G_1$ is d |
| dist:point-plane ($G_{pt}$, $G_{pl}$, d) | Distance between point $G_{pt}$ and plane $G_{pl}$ is d |
| dist:line-circle ($G_1$, $G_2$, d) | Distance between line $G_1$ and circle $G_2$ is d* |
| angle:vec-vec ($G_1$, $G_2$, $\alpha$) | Angle between vector $G_1$ and vector $G_2$ is $\alpha$ |

*In two dimensions, d = 0 represents a tangency constraint

Constraints may apply to subgeoms of a given geom. For example, to constrain two lines to be parallel, one constrains the vectors of those lines to have an angle of zero.

In U.S. patent application No. 07/365,586, geometric invariants were stored as arguments to predicates indicating the translational degrees of freedom and rotational degrees of freedom of the rigid-body geometric entities. This scheme works well for the kinematics domain, but does not always work well for other rigid-body systems or for describing systems which additionally have dimensional degrees of freedom.

A rigid-body cannot always be characterized by well-defined combinations of translational and rotational degrees of freedom. In some situations the degrees of freedom are coupled in ways which cannot be divided neatly into translational and rotational degrees of freedom. Consider a rigid body B with two points, P1 and P2. Let P1 be constrained to lie in a plane, using the dist:point-plane constraint. Let P2 be constrained to a line by a dist:point-line constraint. Then B has three degrees of freedom. But B's degrees of freedom cannot be neatly divided into translational and rotational degrees of freedom.

Let S be the tuple of translational and rotational degrees of freedom (TDOF and RDOF) remaining for B after these two constraints have been applied. Now consider the case where P1 is fixed in the plane by satisfying yet another constraint. Then the new tuple S' of translational and rotational degrees of freedom, is 0 TDOF and 1 RDOF. (B may rotate about the line connecting P1 and P2). This would suggest that the original S was 2 TDOF and 1 RDOF, since only translational degrees of freedom were removed by the new constraint. But consider instead the case where the translation of P2 along the line is fixed by a new constraint. Then the value for S' is 0 TDOF and 2 RDOF (B may rotate so that P1 remains on a circle in the plane, and it may also rotate about the line connecting P1 and P2). This would suggest that the original S was 1 TDOF and 2 RDOF. Thus, depending on subsequent constraints, the degrees of freedom in S decompose into differing numbers of translational and rotational degrees of freedom, making it an ambiguous representation.

A more general approach to representing the degrees of freedom of a geometric entity is to create a data structure that explicitly represents the invariants without assigning them to particular categories (i.e., translational or rotational degrees of freedom). In the preferred embodiment the invariants associated with each geometric entity are stored in a structure called the invariants record, which contains several lists of points, vectors, or tuples. The invariants record representation has the advantage over a predicate-based representation of being easily extensible for new constraint types and for different geom types.

The structure of the invariants record is shown in Table 2. In the table, p represents a point, v a vector, $L^1$ a one-dimensional locus (e.g., circle, line, parabola), $L^2$ a two-dimensional locus (e.g., sphere, hyperboloid), D a dimension, $v_\Re$ a real value, and G a geom.

TABLE 2

| Structure of the invariants record | |
|---|---|
| Invariant points | p |
| 1D-constrained points | $\langle p, L^1 \rangle$ |
| 2D-constrained points | $\langle p, L^2 \rangle$ |
| Invariant vectors | v |
| 1D-constrained vectors | $\langle v, L^1 \rangle$ |
| Invariant dimensions | $\langle D, v_\Re \rangle$ |
| Fixed-distance points | $\langle p, v_\Re \rangle$ |
| Fixed-distance lines | $\langle G_1, v_\Re \rangle$ |

TABLE 2-continued

| Structure of the invariants record | |
|---|---|
| Fixed-distance planes | $\langle G_{pl}, v_\Re \rangle$ |

The "Invariant points" slot of the invariants record is a list of all points embedded in the geom whose positions are invariant. The "1D-constrained points" slot is a list of point, locus tuples denoting those points embedded in the geom which are constrained to lie on one-dimensional loci (similarly for the "2D-constrained points" slot). Vectors, being two-dimensional, can be invariant, or can be constrained to one-dimensional loci (on a unit sphere). Invariant dimensions are those which have been constrained to fixed values.

Figure 7A:
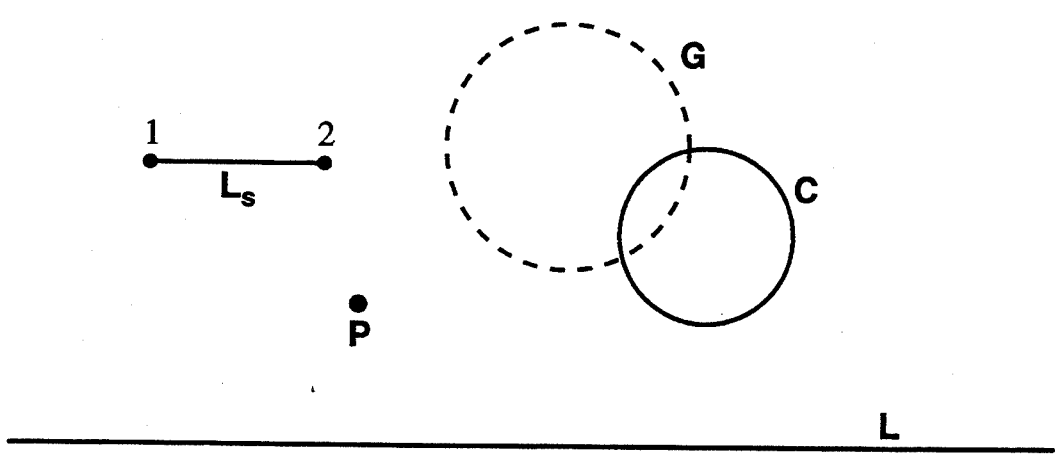
FIG. 7a illustrates the initial conditions of the example.
Figure 7B:
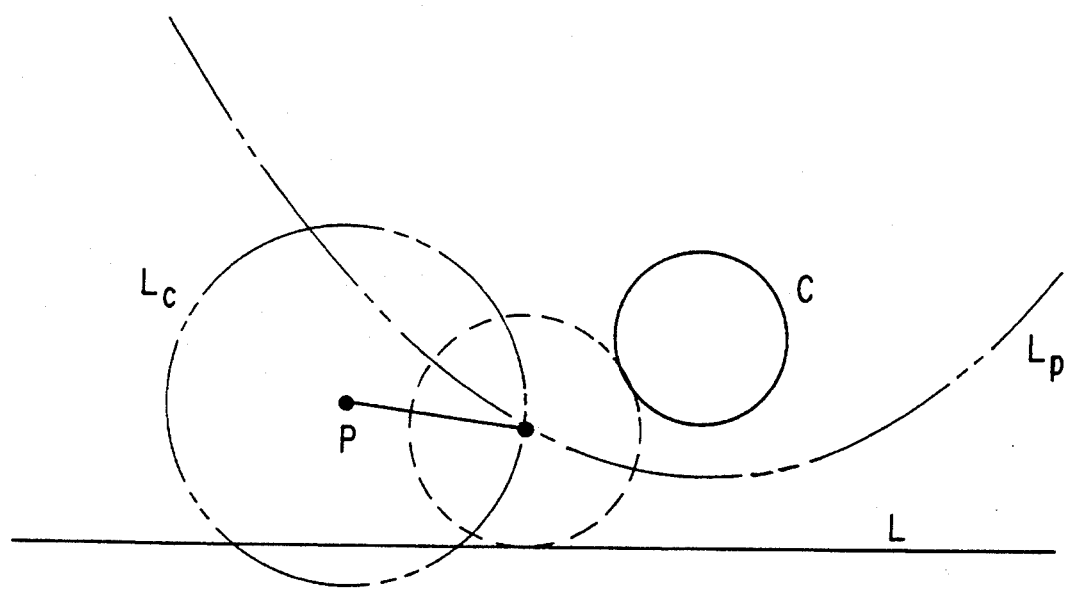
FIG. 7b depicts a solution of the example.

The last three entries in the invariants record are placeholders for relationships that will later constrain dimensions. Their use is illustrated in FIGS. 7a, 7b, and the accompanying text.

The cardinalities of the lists in the invariants record at any given stage of the solution process form an invariants signature. This signature may be used, along with the type of an as-yet-unsolved constraint, to determine the sequence of measurements and actions which will satisfy that constraint. The invariants signature is represented as a vector of integers, which when read left to right, correspond to the cardinalities of the invariants record slots as described in the above table. For example, IR[100_10_1_000] describes a geometric entity that has one invariant point, one invariant vector, and one invariant dimension. The underscored spaces separate the signature into point invariants, vector invariants, dimension invariants, and fixed-distance invariants for ease of reading.

The number of degrees of freedom remaining on a partially-constrained geom is calculated by subtracting the number of degrees of freedom restricted by the invariants (an example of this type of calculation appears herein). If the number of degrees of freedom becomes zero, the geometric entity is said to be grounded, or fixed.

5 Action and locus analysis

The two fundamental types of reasoning carried out by degrees of freedom analysis are called action analysis and locus analysis. The following examples illustrate the preferred embodiment. The action analysis algorithm is described in the Appendix §2 and the locus analysis algorithm is in the Appendix §3. Each example will illustrate the steps used to solve the problem by following the actions which implement degrees of freedom analysis.

EXAMPLE 1: the brick

Figure 6:
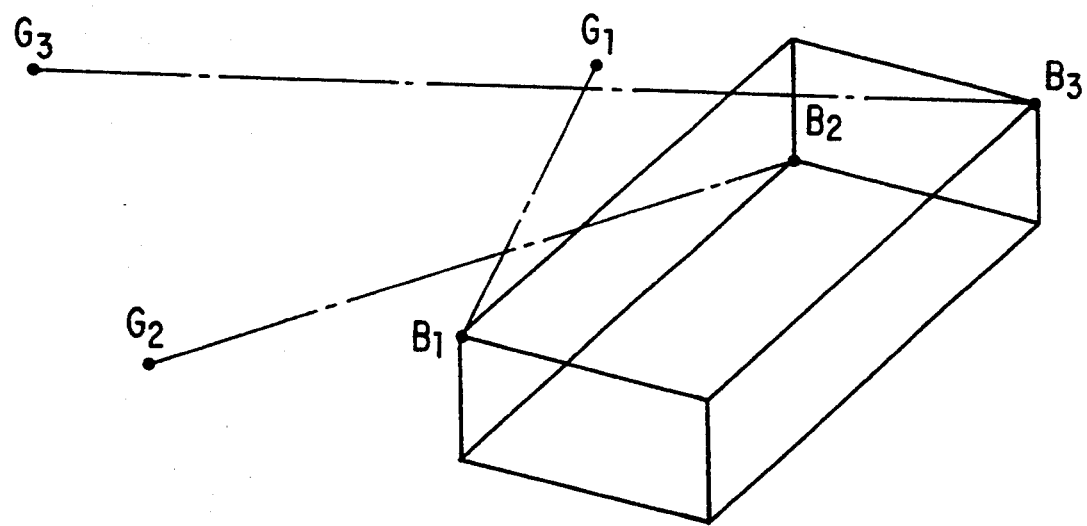
FIG. 6 illustrates an example of a geometric constraint satisfaction problem, where—

Consider a "brick" (a rigid-body geom) with three distinguished points B1, B2, and B3 as shown in FIG. 6. The shape of this "brick" is not important to degrees of freedom analysis. The important information is that this rigid-body geometric entity contains three distinguished points. Now consider another three points, G1, G2, and G3 fixed in the global coordinate system. The problem is to find a configuration for the brick such that B1 is coincident with G1, B2 with G2, and B3 with G3. The constraints to be satisfied are:
dist:point-point($G_1$, $B_1$, O)
dist:point-point($G_2$, $B_2$, O)
dist:point-point($G_3$, $B_3$, O)

These constraints are depicted graphically in FIG. 6. In FIG. 6, the brick is in some arbitrary configuration, and it must be configured so that the three dist:point-point constraints (denoted by gray lines between the points) are all satisfied.

At each step in solving for a geometric entity's configuration, degrees of freedom analysis searches for constraints in which one of the geometric entities is "fixed enough" so that the other geometric entity can be moved to satisfied the constraint. For example, if one geom of a dist:point-point constraint has an invariant position, it is fixed enough for the other geometric entity to be moved to satisfy the constraint. If neither geometric entity is fixed, then it makes sense to delay the satisfaction of the constraint, since both geometric entities might need to be moved subsequently. The process of finding and satisfying constraints using the above strategy is called "action analysis."

A geometric entity need only be "fixed enough" to allow the constraint to be satisfied; it need not be grounded. For example, if a line segment L has a fixed orientation, and one endpoint is constrained to a line parallel to the orientation of the L, then L is "fixed enough" to allow a point to be moved to satisfy a dist-:point-line constraint.

The information required for action analysis is stored in a set of "plan fragment" tables, one for each type of geometric entity. Conceptually, a plan fragment table is a dispatch table, indexed by the invariants signature of the geom and the type of constraint to be satisfied. Each "plan fragment" in the table specifies how to move the geom to satisfy the new constraint using only available degrees of freedom, and specifies what new invariants the geometric entity will have after the action is performed.

Geometric planning begins by selecting a constraint which can be satisfied, and performing the appropriate measurements and actions. While the brick is initially free to move, it does have an arbitrary configuration C0 in the numerical model, as shown in FIG. 6. The particular values of the brick's configuration variables do not affect the symbolic model.

Figure 6A:
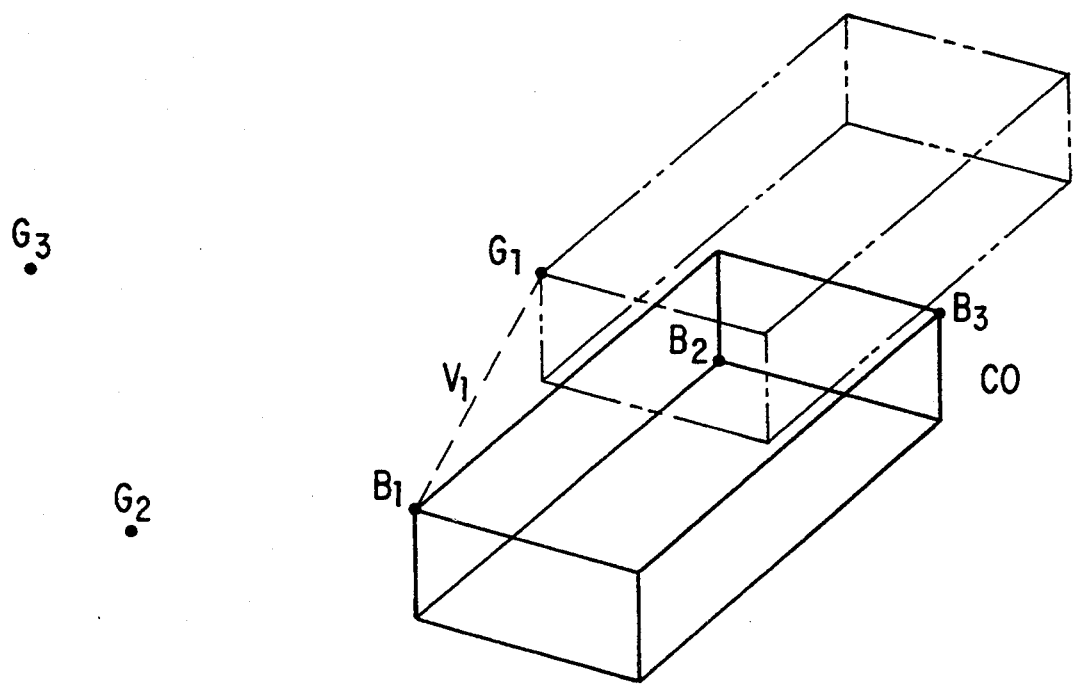
FIG. 6a schematically depicts transformation of the geometric entity (brick) from a first configuration to a second configuration.

A trace of the solution process serves to illustrate the geometric planning. The method decides to satisfy dist: point-point (G1, B1, O) first; it could have chosen any of the constraints. To satisfy this constraint, the method measures the vector from B1 to G1. It then translates the brick by that vector, leaving the brick in configuration C1, shown in gray in FIG. 6a. If dist:point-point (G1, B1, O) is to remain satisfied when future actions alter the brick's configuration, those future actions must be restricted to rotations about G1 (or equivalently, about B1). The method ensures this by marking point B1 on the brick as being an invariant point.

The method generates this sequence of measurements and actions by looking up the appropriate template in the plan fragment table, and binding the template's variables appropriately. Initially the brick has no invariants (its initial invariants signature is IR[000_0-0_0_000]). The plan fragment that is invoked contains the following information (descriptions in this and subsequent figures have been syntactically "cleaned up" for ease of reading):

Geom type: rigid-body
Constraint: dist:point-point(?geom1,?geom2,?d)
Invariants signature: IR[000_00_0_000]

-continued

Measurements and actions:
begin
    ?fixed=fixed-geom(?geom1,?geom2);
    ?free=free-geom(?geom1,?geom2);
    ?sphere=make-sphere (?fixed,?d);
    ?dest=projection(?free,?sphere);
    ?parent=top-level-parent (?free);
    translate (?parent, vec-diff(global-loc(?dest), global-loc (?free)));
end;
Bookkeeping:
if?d==0
    add-invariant-point(?free,?parent)
else
    add-2D-constrained-point(?free,?sphere,?parent);

Explanation:

Geom ?parent is free to translate. A dist:point-point constraint must be satisfied between point ?fixed whose global position is known to be invariant, and point ?free on ?parent. Therefore ?parent is translated by the vector from the current global position of ?free to a point on the sphere of radius ?d around point ?fixed with known global position. This action removes one translation degree of freedom if ?d is non-zero, and removes all three translational degrees of freedom if ?d is zero.

The plan fragment specifies how to move geom of type rigid-body, with an invariants signature of IR[0-00_00_0_000], to satisfy the constraint. The fixed and free geometric entities-both of which are points—are determined via functions called fixed-geom and free-geom, which check the invariant statuses of ?geom1 and ?geom2. The effect is to assign a directionality to the constraint. In this example, G1 is the fixed geom and B1 is the free one. Since B1 is embedded in a rigid body, the rigid body plan fragment table is used, and all operations (e.g., translate) are applied to the parent rigid body. The function top-level-parent follows the "parent" relation transitively until it reaches a geom which has no parent. The function global-loc returns the location (position for a point, orientation for a vector) of a primitive geom in the global coordinate system. The projection function is used to calculate the minimum alteration to the brick's current position that will satisfy the constraint. The textual explanation—with variable names replaced by their bindings—helps a user understand the solution process.

After moving the brick, the plan fragment updates the invariants record of the brick to show that it has one invariant point, since the distance parameter of the constraint was zero. Note that the bookkeeping section of the plan fragment is responsible for noticing that a point is a degenerate case of a sphere (a sphere of radius zero). The invariants record of the brick now has a signature of IR[100_00_0_000].

Figure 6B:
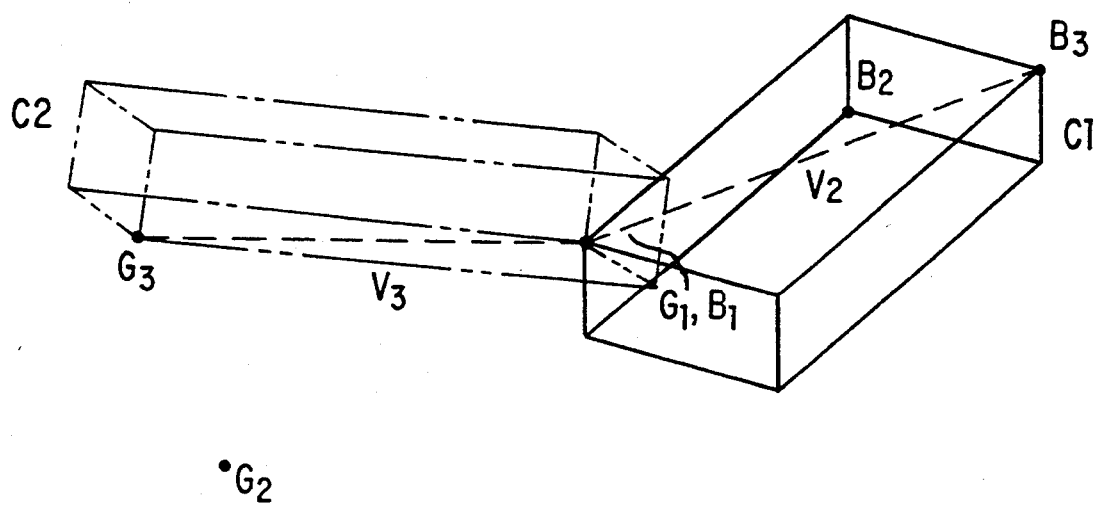
FIG. 6b illustrates the transformation of the geometric entity (brick) from a second configuration to a third configuration.

The method next chooses to satisfy dist:point-point(G3, B3, O); again, either of the remaining constraints could have been chosen. See FIG. 6b. The method measures the vector V1 from G1 to G3 (where B3 must be placed), and vector V2 from G1 to B1. These two vectors are shown as dashed lines in FIG. 6b. Since the desired distance between the two points is zero, the problem can be solved only if the point G3 lies on a sphere centered at G1, with radius |V2|.

In order to move the brick, the method requires a line about which to rotate it. The point B1 lies on this line, and if the rotation is to move B3 to coincide with G3, one acceptable line direction is the normal to the plane in which V1 and V2 lie. The amount to rotate the brick is tile angle between these vectors, measured from V1 to V2. Therefore, the brick rotates about B1 around vector v1—v2 by the angle between V1 and V2. This action brings the brick to configuration C2, which satisfies dist:point-point (G3, B3, O) without violating dist-:point-point(G1, B1, O). This action also removes two of the remaining rotational degrees of freedom; in order to preserve the two already-satisfied constraints, all future actions must be rotations about line segment $\overline{G1G3}$.

Once again, the sequence of measurements and actions is obtained by direct lookup in the plan fragment table. The actual measurements and actions are more complicated than described above, in order to handle the general case of a non-zero distance:

---

Geom type: rigid-body
Constraint: dist:point-point(?geom1,?geom2,?d)
Invariants signature: IR[100_00_0_000]
Measurements and actions:
begin
    ?fixed = fixed-geom (?geom1,?geom2);
    ?free = free-geom (?geom1,?geom2);
    ?parent = top-level-parent (?free);
    ?point = get-invariant (?parent, "Invariant points", 1);
    ?v1 = vec-diff (?fixed,?point);
    ?v2 = vec-diff (?free,?point);
    ?sphere1 = make-sphere(?fixed,?d);
    ?sphere2 = make-sphere(?point, mag(?v2));
    ?circle = intersect (?sphere1,?sphere2);
    if?circle==null
    begin
        if(mag (?v1) + mag (?v2) <?d)
            then?error=?d − (mag (?v1) + mag (?v2))
            else?error=abs (mag (?v1) − mag (?v2))−?d
        error("Dimensionally inconsistent",?error);
    end
    ?dest = projection(?free,?circle);
    ?v3 = vec-diff(?dest,?point);
    ?cp = cross-prod(?v2,?v3)
end;
Bookkeeping:
if?d==0
    add-invariant-point (?free,?parent)
else
    add-1D-constrained-point (?free,?circle,?parent);

---

Explanation:

Geom ?parent has zero translational degrees of freedom, but may rotate about ?point. If the points ?fixed and ?free have distances from ?point which differ by no more than ?d, the problem is solved by rotation about ?point. Otherwise, the problem is dimensionally inconsistent. If ?d is zero, geom ?parent is left with one degree of freedom; otherwise it has two degrees of freedom.

A new feature of this plan fragment is the use of conditional statements to check the values of quantities. The two spheres ?sphere 1 and ?sphere2 will not intersect in the following situations:

$$|v1|-|v2|>d$$

$$|v2|-|v1|>d$$

$$|v1|+|v2|<d$$

In these situations, ?circle will be null. An error value is calculated to indicate the severity of the problem. In all other cases, a solution is possible. Since, in the brick example, ?d is zero, another invariant point is added, and the invariants signature becomes IR[200_0-0_0_000].

Figure 6C:
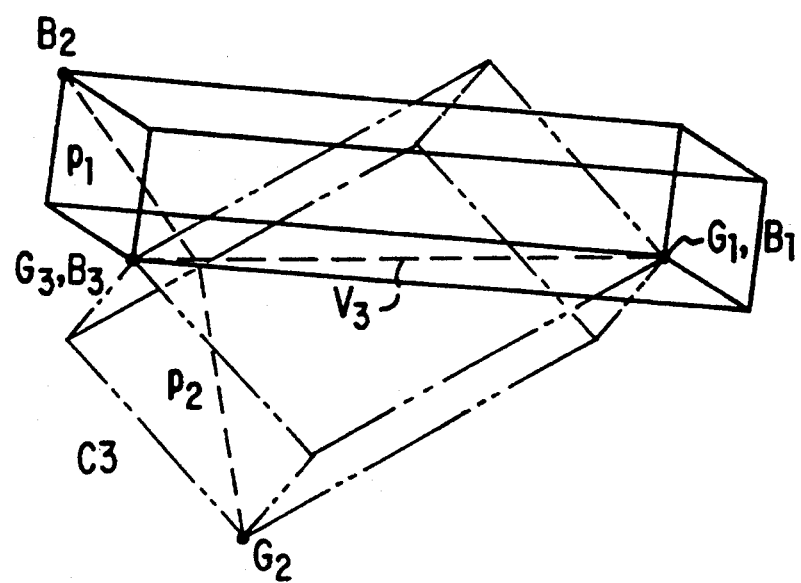
FIG. 6c depicts the transformation of the geometric entity to a configuration satisfying the problem.

Turning to FIG. 6c, to satisfy the final constraint dist:point-point (G2, B2, O), the method constructs a perpendicular from B2 to line segment G1, G3, and creams a circle with radius equal to the magnitude of the perpendicular, centered at the base of the perpendicular, and with axis in the direction of line segment G1, G3. If the circle is non-degenerate (has a non-zero radius), and it intersects point G2, a solution is obtained by rotation about line segment. This action brings the brick to configuration C3, which satisfies all three dist-:point-point constraints. If the circle is degenerate (i.e., a point), no actions are taken, and no degrees of freedom are constrained. In the non-degenerate case, the action reduces the brick's remaining degrees of freedom to zero, by adding another invariant point.

Action analysis provides a simple way of decoupling the constraints pertaining to a single geometric entity. It may be understood in the context of rewriting systems. A set of rewrite rules is "canonical" when all the normal forms of each expression are identical. In such cases, the order in which the rules are applied does not matter; the result is always the same. When a set of rules is canonical, any applicable rule may be invoked, and "progress" will be made toward the solution. No ordering of the rules need be done, although it may be useful to guide the order of rule invocations to improve the efficiency of the process. Similarly, action analysis may be viewed as the process of repeatedly updating a geom's invariants record. Action analysis is canonical in the sense that, regardless of the order in which the constraints are satisfied, the invariants record of the geom at the end of the process is always the same.

EXAMPLE 2: constraints on a circle

The brick problem illustrated how action analysis is used to generate a sequence of measurements and actions to satisfy a set of geometric constraints. For each of these constraints, one geometric entity must be invariant, or "fixed enough." This condition, however, is not always encountered in geometric constraint satisfaction problems. Often, geoms interact with each other in more complex ways that require the satisfaction of constraints between partially constrained geometric entities. This corresponds to the solution of nonlinear simultaneous equations in the algebraic domain.

A problem involving constraints that can only be solved by considering their interactions is shown in FIG. 7a. This problem is a planar problem, i.e., all geoms are constrained to lie in a particular plane. The problem involves the following geometric entities:

A circle C, of fixed position, orientation, and radius (grounded).

An infinite line L, of fixed position and orientation (grounded).

A grounded point P.

A line segment $L_S$ of fixed length, free to translate and rotate within the same plane as C and L. The invariants of the line segment record that one endpoint is constrained to a two-dimensional locus (a plane), and the line segment's vector is constrained to a 1D locus (perpendicular to the plane's normal); the invariants signature is IR[001_01_1_000].

A circle G, free to translate in the same plane as C and L, as well as free to change radius; however, the axis of the circle is constrained to be the same as the normal to the plane: the invariants signature is IR[001_10_0_000]. G is shown as a dashed circle in FIG. 7a.

The additional constraints to be solved are:
1. dist:point-point(end-1($L_S$), P, O)
2. dist:point-point(end-2($L_S$), center(G), O)
3. dist:line-circle(L, G, O)
4. dist:circle-circle(C, G, O)

These constraints will be referred to by number in the following discussion. Since the constraints can be satisfied in any order, they will "arbitrarily" be attempted in the order in which they appear above.

Action analysis can be used to satisfy most of these constraints. Constraint 1 can be satisfied because point P is grounded. Therefore, line segment $L_S$ is translated to bring end-1($L_S$) into coincidence with point P. The invariants signature of $L_S$ becomes IR[100_01_1_000]. Constraint 2 cannot yet be satisfied, because neither the center of circle G nor end 2 of $L_S$ are grounded.

Constraint 3 can be satisfied by action analysis because line L is fixed. No restrictions can be placed on the location of the center of the G, nor on its radius. The invariant that is added to the invariants record is of the "fixed-distance lines" class. This invariant records the distance from the circle perimeter to the line (in this case zero). It serves to indicate that, were the radius of the circle fixed, the center would be restricted to a one-dimensional locus, or, were the center fixed, the radius would be known. This relationship restricts one degree of freedom, and results in an invariants signature for G of IR[001_10_0_010].

Constraint 4 can be satisfied because circle C is fixed. The combination of constraint 4 and the fixed-distance line invariant is used to deduce that the center of G is in fact restricted to a one-dimensional locus; this is the parabolic locus shown in FIG. 7b. The center of G, which was previously constrained to a two-dimensional locus (the plane), is "promoted" to a one-dimensional locus; the invariants signature of G changes to IR[0-10_10_0_010].

Constraint 2 still cannot be satisfied, since neither center (G) nor end-2($L_S$) have become grounded through the solution of other constraints. However, there is enough information to satisfy this constraint.

Locus analysis determines where in global space certain classes of partially constrained geometric entities must lie. If a subgeom is embedded in a parent geom that is not yet grounded but which has some geometric invariants, that subgeom is restricted to lie in a subregion of space. The locus of possible locations for the subgeom is a function only of the subgeom's position within its parent geom, and of the parent geom's degrees of freedom. When two partially constrained geometric entities are related by a constraint, the globally acceptable locations for those geometric entities often may be derived by intersection of their locally determined loci of possible locations. Once the global location is known, action analysis is once again used to move the relevant geometric entities to satisfy the constraint.

A collection of locus tables describes the loci of points, lines, and vectors embedded in a geom as a function of the invariants of that geom. A locus intersection table enables deduction of globally acceptable locations for pairs of geometric entities constrained by multiple loci. If the intersection yields a finite set of points, the locus intersection table also contains information about the maximum number of real roots the intersection equation may have; a branch variable is introduced into the solution to let a user of degrees of freedom analysis specify which branch of the solution should be used for the problem solution.

Even though an intersection may have several branches (or solutions), the solutions are topologically equivalent in that all loci resulting from the intersection are of the same dimensionality. Thus, a locus intersection is a single abstract solution which can be instantiated by choosing a branch variable value. In this manner, a class of instantiable solutions are represented by a vector of branch variables associated with an assembly plan, and a specific solution by a vector of branch variable values.

At the current stage of tile solution, $L_S$ has an invariant endpoint, a vector constrained to be normal to the plan of the problem, and a fixed dimension. Thus, $L_S$ has one degree of freedom (a line segment has 6 degrees of freedom in three space; an invariant point subtracts 3 degrees of Freedom, a 1D-constrained vector removes 1, and an invariant dimension subtracts 1, leaving one remaining degree of freedom). Therefore, any points on the line segment must have no more than one degree of freedom The locus tables indicate that end-2($L_S$) is restricted to a circle locus, shown as FIG. 7a.

The location of center (G) has already been restricted to the parabola locus $L_p$ via the solution of constraints 3 and 4. This allows constraint 2 to be satisfied as follows:
1. Intersect loci $L_p$ and $L_c$. Since multiple intersections are possible, a branch variable is assigned to the chosen solution so that the same intersection may be chosen in a subsequent solution of the constraint system.
2. Use action analysis to rotate $L_S$ so that end-2($L_S$) is coincident with the intersection point. This action grounds $L_S$.
3. Use action analysis to translate circle G so center(G) is coincident with the intersection point. Using the information stored in the "fixed-distance lines" slot of the invariants record, set the circle's radius so the perimeter touches line L. These actions ground G.

Locus intersection, followed by another round of action analysis thus grounds the remaining geometric entities and completes the solution of this constraint problem.

Another technique, called locus propagation, which is sometimes also called extended locus analysis, allows solving a broader class of constraint problems analytically. Locus analysis, as described previously, allows determining the locus of partially-constrained subgeoms solely as a function of the invariants of the parent geom. Locus propagation allows determining the loci of subgeoms as a function of the invariants of the parent geom and the loci of other subgeoms of the parent geom.

The use of locus propagation is illustrated as follows: If a point on one geom G is restricted to a locus, then subgeoms on a geom H which is yet to be moved relative to G may be restricted to a same- or higher-dimensional locus, depending on properties of H. For example, if H has a fixed distance between subgeom points h1 and h2, and h1 is to be made coincident with a point g1 in G restricted to a circle locus, then h2 is restricted to a toroidal region of space. If the orientation of H is fixed as well, then h2 is restricted to a circle which is a displaced version of the circle locus of g1 (or equivalently, h1). The locus of h2 may then be used in locus analysis.

Figure 10A:
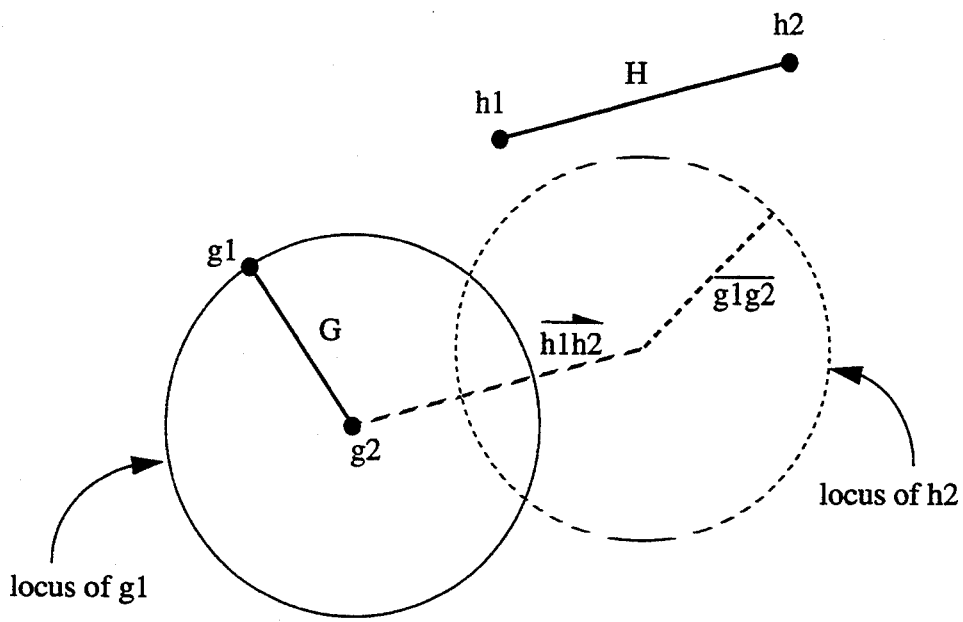
FIG. 10a illustrates the location of geometric entities G and H prior to constraint solution.
Figure 10B:
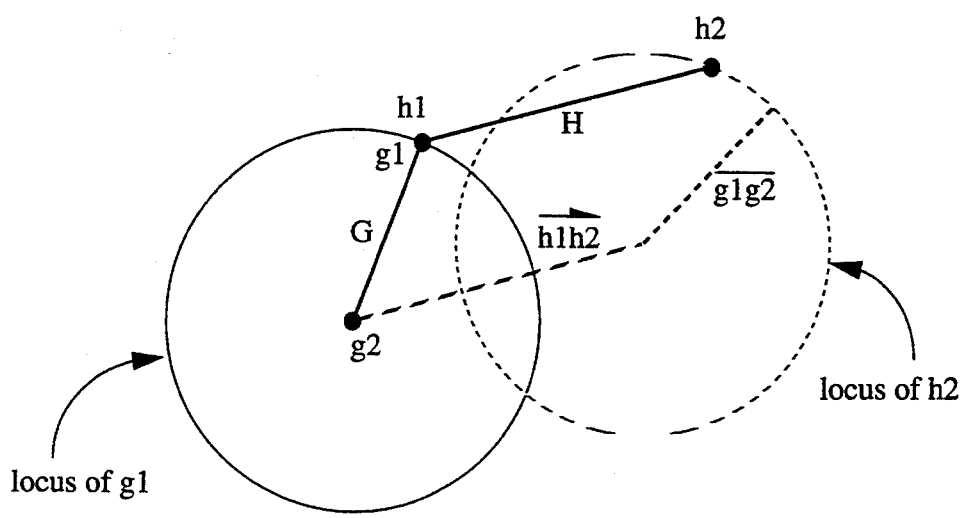
FIG. 10b illustrates the location of geometric entities G and H after constraint solution.

This process is illustrated in FIGS. 10a and 10b. In FIG. 10a, line segment G is restricted to rotate in the plane of the figure about endpoint g2; therefore, point g1 is confined to a circle locus. A coincidence constraint is to be satisfied between points g1 and h1 (i.e., a dist:point-point(g1, h1, O) constraint). This constraint allows inferring that point h1 must be confined to the same locus as point g1. Since the orientation of line segment H is fixed, the locus of endpoint h2 may be deduced: it is the circle locus of point g1 displaced by the vector $\overline{h1h2}$, and with radius $\overline{g1g2}$. Now that the locus of point h2 is known, it may be used (for example, in locus analysis) to determine the location of h2 that satisfies other constraints. Once this location is known, H may be translated to the appropriate position. This action brings point h1 onto the circle describing g1's locus. Then G may be rotated, in order to satisfy the constraint dist:point-point(g1, h1, O). The final configurations of G and H are shown in FIG. 10b.

Note that the locus of h2 was deduced without moving geom H. Propagating such locus information across multiple geoms allows solving a number of problems which would otherwise require iteration. Locus propagation may be implemented in a number of ways, including: using a set of tables, in a manner analogous to locus analysis; or using generalized rules.

The plan fragments are small "subroutine" programs that satisfy a constraint without violating any of the invariants already pertaining to the geometric entity being moved. When a new geometric entity type or constraint type expands the ontology of the system, new plan fragments must be written, and the plan fragment tables expanded. Each geom type has its own plan fragment table; thus, the plan fragment table for a circle is different from that of a line segment. Since the plan fragment table is accessed by the invariants signature of a geometric entity, the number of entries in the plan fragment table depends on the number of possible invariants signatures for that geometric entity.

The geometric entity representations sometimes allow redundant descriptions of the same state. For example, a grounded line segment could be described by an invariant dimension, an invariant point, and an invariant vector (IR[100_10_1_000]). However, it could be described equally well by two invariant points (IR[200_00_0_000]). Thus, for each geometrically distinct state, a set of invariants records may describe the geometric entity, forming an equivalence class. To minimize the number of plan fragments in each table, one member of each equivalence class is (arbitrarily) designated the "canonical" invariants record. Then, each plan fragment is written so that only canonical invariants records can result from satisfying the constraints. At present, this task is performed manually; automating this process, or at least checking it for consistency, would greatly improve the knowledge engineering process.

Many entries in the various plan fragment tables share a similar structure. For instance, moving a line segment with no invariants to satisfy a dist:point-point constraint uses the same measurements and actions as moving an unconstrained circle or rigid body. To reuse generic strategies, the plan fragments are written in a Mathematica-based system for translating high-level code descriptions into lower-level languages. A single routine can then be used in several different plan fragments.

Verification of the plan fragments is achieved by exhaustive unit testing which takes into account all possible geometric degeneracies. A "geometric construction checker," analogous to a theorem checker, would improve the verification process.

6 Loop and chain analysis

The previous examples were relatively simple in that all constraints could be solved with action and locus analysis being repeatedly used to "grow" the set of grounded geometric entities, thus allowing more constraints to be satisfied. More complex problems require solving sub-networks (loops or chains) of the constraint network in isolation, then reformulating those substructures as rigid bodies which can then be moved to solve other portions of the constraint network.

EXAMPLE 3: hierarchical grouping of geometric entities

Figure 8:
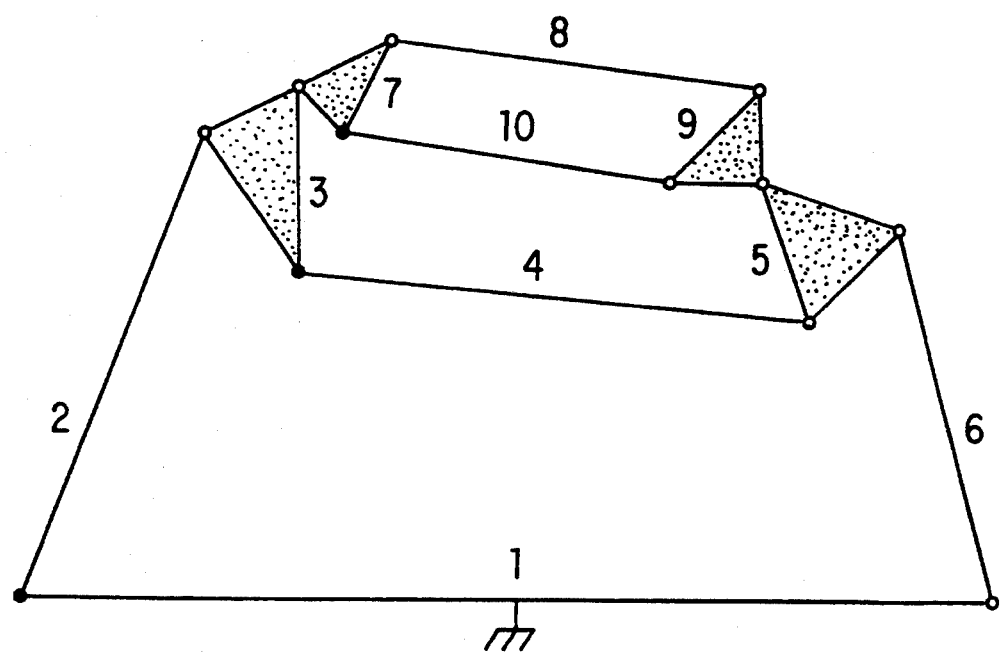
FIG. 8 schematically depicts a ten-bar linkage "recursively" composed of four bar linkages.

An example of a constraint system requiring analysis of constraint loops and chains is the ten-bar mechanical linkage shown in FIG. 8. Its structure is that of a four-bar linkage, whose coupler bar is composed of another four-bar, whose coupler is composed of yet another four-bar.

In FIG. 8, the geometric entities (called links in the mechanisms domain) have been labeled 1 through 10. All links are constrained to be in the plane. The joints connecting the links are modeled with dist:point-point constraints, all with zero distances. This system has three internal degrees of freedom, and hence requires additional constraints to fully constrain the system. The three joints in FIG. 8 which are solid black (connecting links 1 and 2, links 3 and 4, and links 7 and 10) are additionally constrained by angle:vec-vec constraints. In addition, link 1 is grounded (as indicated by the "foot" in the center of the link).

Figure 9A:
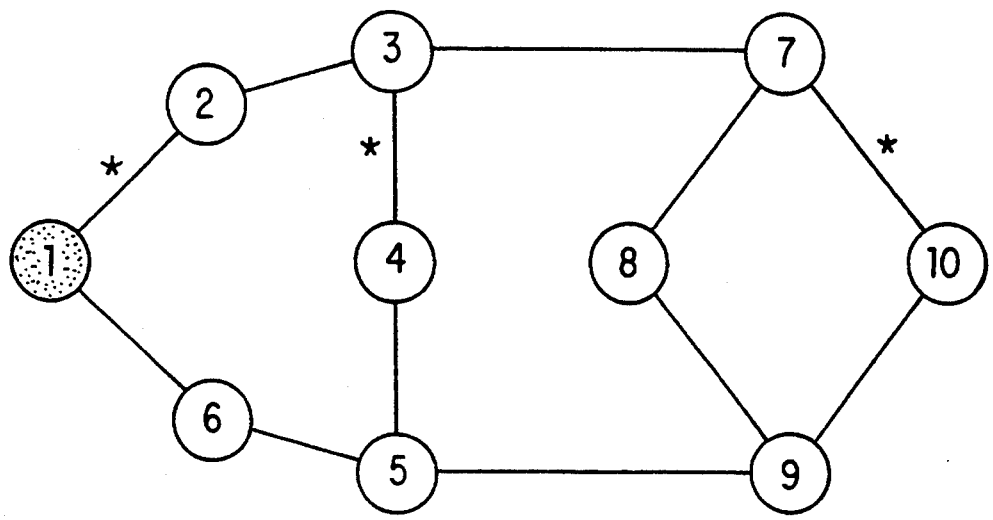
FIG. 9a is a graph of the ten-bar linkage of FIG. 8.

In order to search for rigid substructures, degrees of freedom analysis employs a graph representation of the constraint system. In the constraint graph, nodes represent geometric entities, and arcs represent collections of one or more constraints (the terms geometric entity, geom and node are used interchangeably). FIG. 9a shows the graph of the constraint system of FIG. 8 before solving. The node numbers correspond to the link numbering in FIG. 8. The grounded geometric entity in this and subsequent graphs is shaded for easy identification.

Figure 9B:
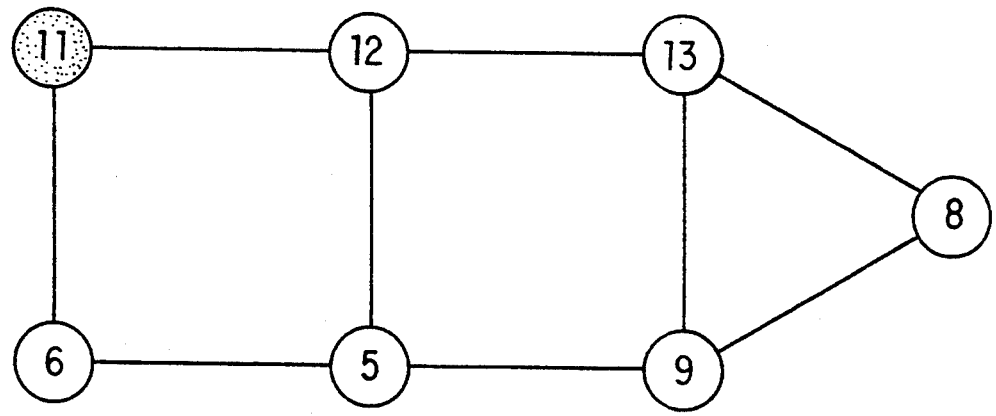
FIG. 9b is a reduction of FIG. 9a, replacing pairs of geometric entities with macro-geom entities.

In the absence of the constraints to be satisfied, each rigid-body geometric entity in the system has 3 degrees of freedom since each body is constrained to the plane. The arcs in the graph of FIG. 9a which are marked with an asterisk restrict 3 degrees for freedom since they have dist:point-point constraints with zero distance, and angle constraints. Thus, satisfaction of the constraints on one of these acs will cause the two geometric entities which they relate to be fixed rigidly with respect to each other. Acyclic collections of such geometric entities are called chains. Degrees of freedom analysis satisfies these constraints first, and reformulates each pair of geometric entities as a single rigid-body geometric entity, also called a macro-geom. The resultant graph is shown in FIG. 9b, where geometric entities 1 and 2 have been assembled to form geom 11, geometric entities 3 and 4 have formed geom 12, and 7 and 10 have formed geom 13.

In the new graph, all remaining arcs have a single dist:point-point constraint that, in the plane, restricts two degrees of freedom. No rigid chains remain, so degrees of freedom analysis next looks for rigid loops in the constraint graph. Consider what would happen if the loop of nodes 11, 12, 6, and 5 were to be satisfied using action and locus analysis. Each of the three non-grounded geometric entities has 3 degrees of freedom, for a total of 9 degrees of freedom. The three constraints restrict only 6 degrees of freedom leaving 3 remaining degrees of freedom. In other words, that loop would not be rigidly fixed. In contrast, consider loop 8,9,13. Were one of the geometric entities grounded, this loop would have zero degrees of freedom. Finding a loop's degrees of freedom is analogous to determining the mobility of a mechanism, and the solutions are quite similar.

Figure 9C:
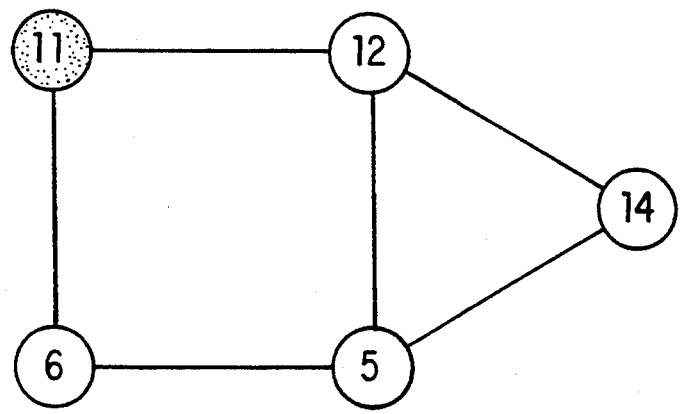
FIG. 9c is a reduction of FIG. 9b, replacing a loop with a single node.

Degrees of freedom analysis of the present invention identifies the loop with the lowest number of degrees of freedom, in this case, loop 8,9,13. The Appendix §5 describes the algorithm used for identifying loops. The loop solver algorithm is described in the Appendix §6. The method temporarily grounds one of the geometric entities in this loop and uses action and locus analysis to solve for the constraints on the arcs connecting the three nodes. Next, it reformulates the composite geometry as a macro-geom, shown as node 14 in FIG. 9c. This will in turn allow loop 12,14,5 to be reformulated as a macro-geom, which will enable the solution of the remaining constraints.

Figure 2:
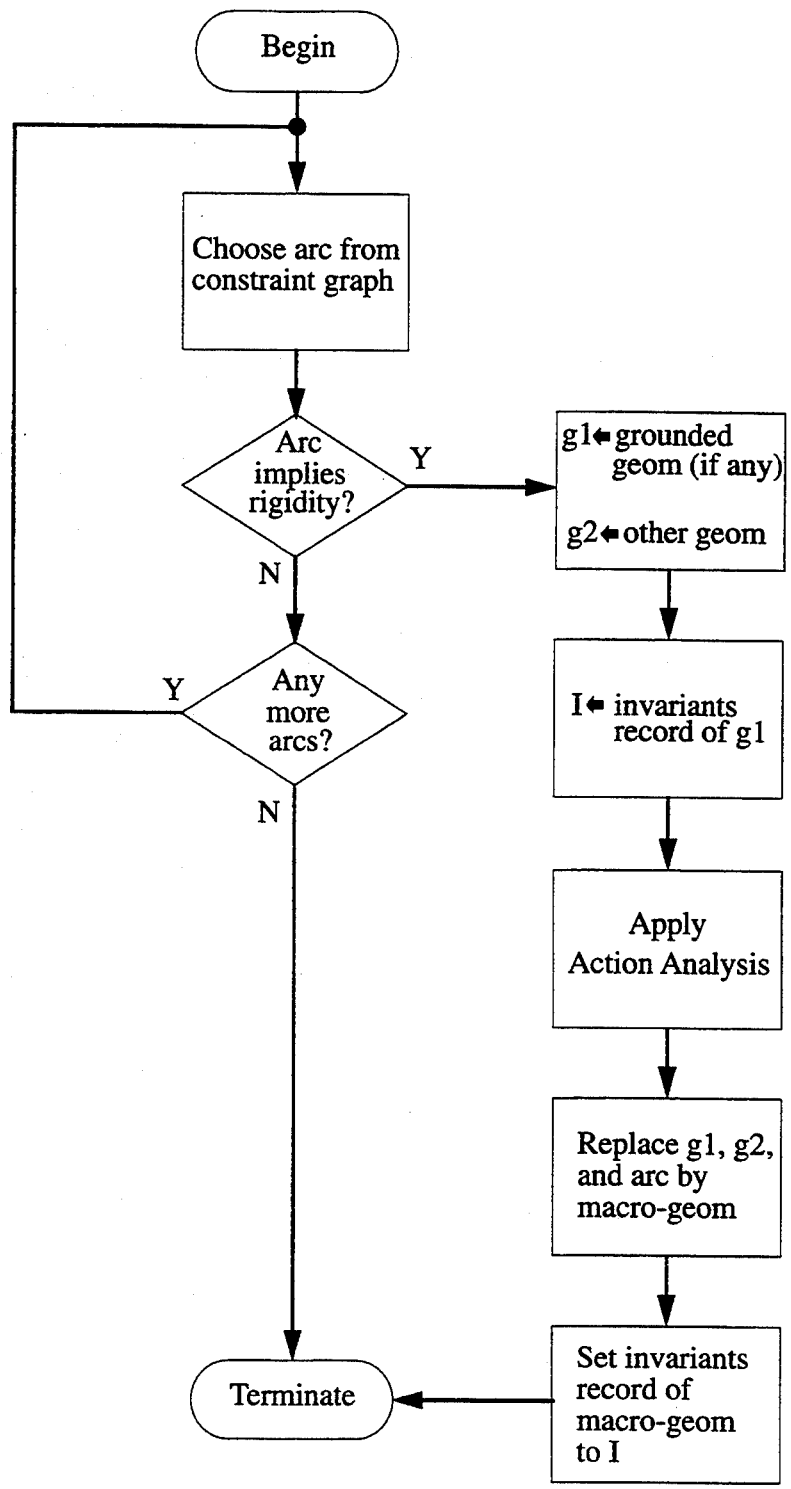
FIG. 2 is a flow chart describing the process for satisfying the constraints of a rigid chain of arbitrary links.
Figure 3:
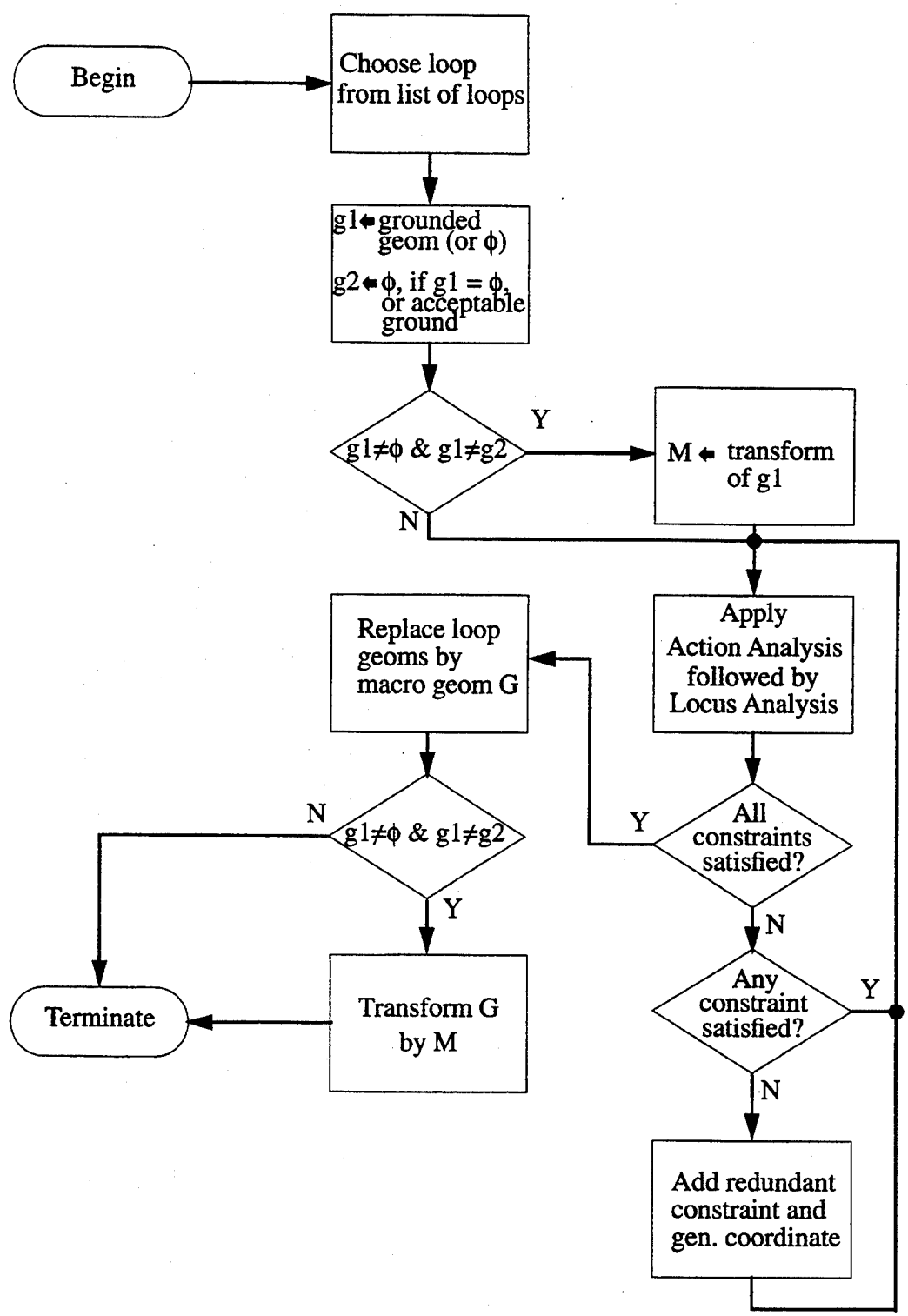
FIG. 3 is a flow chart illustrating the process for solving the constraints in a loop.

Position analysis is the term sometimes used for the top-level strategy employed in degrees of freedom analysis of the present invention and is illustrated in FIG. 1. Next, rigid chains are identified, solved, and reformulated as macro-geoms. FIG. 2 illustrates the process for solving chains, while Appendix §4 describes in detail the chain solving algorithm. Next, the loop with the fewest degrees of freedom is identified, solved, and rewritten as a macro-geom. FIG. 3 illustrates the process for solving loops and Appendix §5 and §6 describe the algorithms for identifying and solving loops, respectively. The process is repeated as shown in FIG. 1 until the entire constraint graph is rewritten as a single node. Appendix §1 describes the algorithm in detail.

Cases where no loop in the constraint system is rigid indicate one of two possible situations:

(a) The system is underconstrained, or (b) The system has no closed-form solution.

In such cases, degrees of freedom analysis proceeds by identifying the loop with the fewest degrees of freedom, and adding as many redundant constraints to the system as are required to make the loop rigid. These redundant constraints are called defaults. U.S. patent application No. 07/675,592 describes a method for sorting dependencies among geometric entities and allocation of degrees of freedom.

Figure 4:
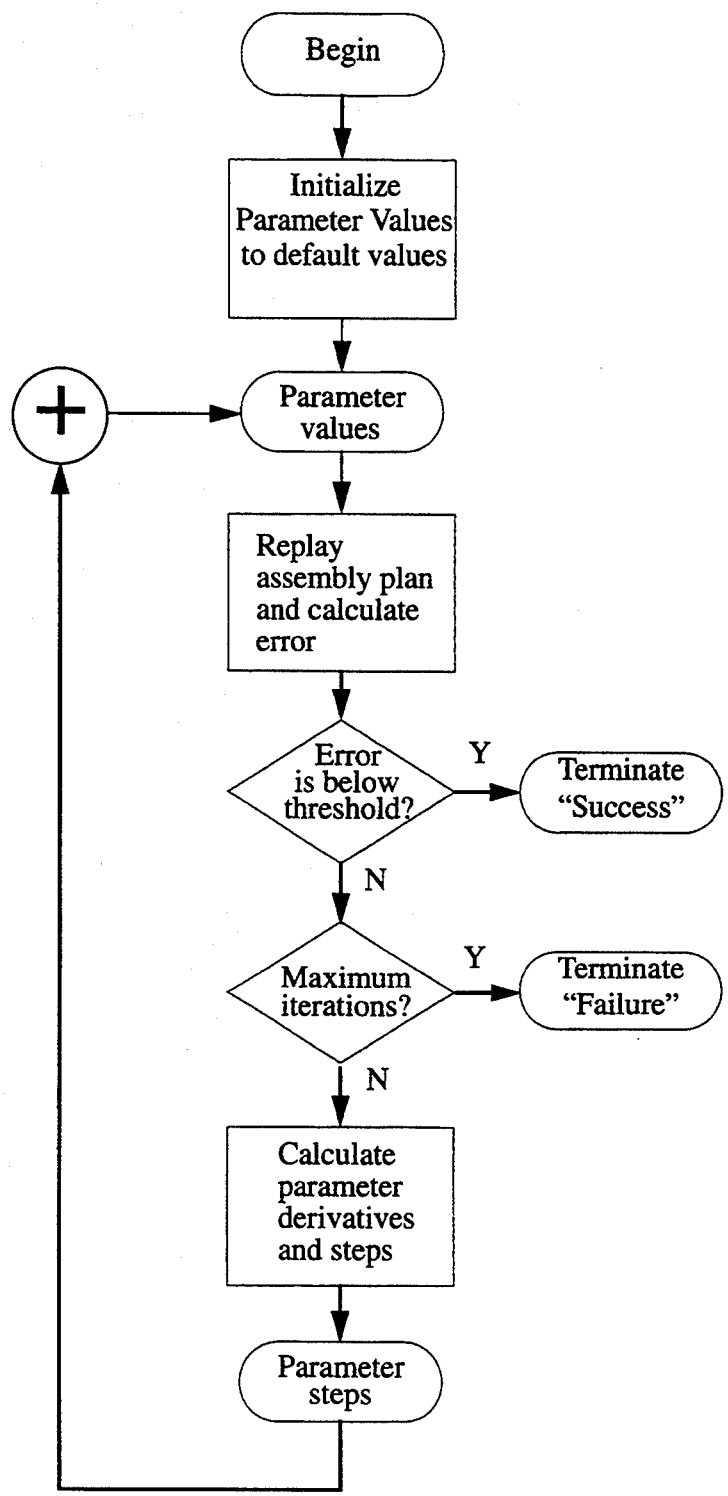
FIG. 4 is a flow chart depicting the iterative solver used when the system is underconstrained or has no closed-form solution.

In case (a), the defaults serve to parameterize the remaining degrees of freedom in the system. In case (b), the constraints yield a near-minimal set of redundant generalized coordinates for use in an efficient iterative solution to the constraint system. Iterative solutions are formulated in the following manner: A set of parameter values are chosen for the defaults, and assembly of the geometry is attempted. If the geometry cannot be assembled, the error functions in the plan fragments accumulate an error proportional to the degree to which the assembly is incorrect. Traditional optimization schemes are then used to vary the default parameters until the error term vanishes. This iterative solver process is illustrated in FIG. 4.

Once method of the present invention has committed to solving a particular loop, it will not backtrack. Therefore, if the loop is degenerate in some way, a redundant generalized coordinate may be introduced when in fact solving a different loop first would have obviated the need for a redundant generalized coordinate. While this does not affect the quality of the answer to the it does affect the efficiency of the solution process.

The system described in U.S. patent application No. 07/365,586. was employed as a simulation "compiler" by storing the sequence of measurements and actions in a reexecutable plan structure. This allowed typically linear behavior, with a worst case $O(n \log n)$, in the simulation of mechanisms, where n is the number of links. In its expanded scope, the present invention still utilizes a plan representation; however, rather than a linear array, a tree is used to store the plan. Each node in the plan tree has different exit points depending on the number of degrees of freedom absorbed by the constraint. Upon re-execution with different dimensions or constraint parameters, a new geometric degeneracy may arise, causing a new branch of the plan true to be generated and stored. This allows caching solutions from various degenerate geometries. The tree-style plan representation is currently believed to be the preferred form.

In many situations, such as a collection of 3D geoms all confined to a single plane, geometric degeneracies are likely to arise. In such a case, planning the entire solution using the purely symbolic approach followed by executing that plan may result in wasted effort, as a plan step executed early in the plan may encounter a degeneracy which necessitates replanning from that point. In a preferred embodiment, therefore, planning may be interleaved with execution of the plan fragments so that degeneracies are detected at the time the plan step is chosen. When such a plan is replayed with different numerical values, a previous degeneracy may vanish or a different degeneracy may be encountered, necessitating incremental replanning.

7 Conclusion

The degrees of freedom analysis of the present invention provides low-order polynomial-time solution techniques for the solution of geometric constraint satisfaction problems. Problems are solved in $O(cg)$ time, where c is the number of constraints, and g is the number of geometric entities. Details of the complexity analysis are provided in the Appendix.

In the degrees of freedom analysis method, the constraint satisfaction process is canonical. At any stage of the solution process, a number of choices may exist as to which constraint to satisfy next. Any choice may be made, with no effect on the final answer. Proving that the position analysis algorithm (FIG. 1) is canonical is done by proving that chain and loop rewriting are confluent, and then showing that this implies that the algorithm is canonical.

"Confluence" is defined in this context as the property that whenever a subgraph in the constraint graph can be rewritten in two different ways, say to $I_1$ and $I_2$, then $I_1$ and $I_2$ can both be rewritten to some common graphs.

While symbolic solution of the algebraic equations describing geometric constraints is NP-complete in general, degrees of freedom analysis allows generating closed-form solutions, or efficient iterative solutions, to geometric constraint satisfaction problems in polynomial time. This avoids the problem of computational intractability found in symbolic algebra systems. Typically, the resulting closed-form solutions may be executed in time linearly proportional to the size of the constraint system being analyzed, and are substantially more efficient than iterative numerical techniques.

The power in the degrees of freedom method of the present invention comes from the use of the metaphor of incremental assembly. This allows for maximal decoupling of the constraints. The number of constraint satisfaction methods can grow quickly with the types of objects and types of constraints—$O(c^n)$, where c is the number of constraint types, and n is the number of degrees of freedom in an unconstrained geometric entity. By using degrees of freedom as equivalence classes, degrees of freedom analysis coalesces many of these states, thereby creating a more manageable search space.

A number of alternatives exist for extending the degrees of freedom analysis method. For example, the plan tree is currently recomputed whenever the topology of the constraint problem changes. This can be inefficient if constraints are only being added. However, re-use of the tree may result in the retention of previously-added redundant generalized coordinates which are no longer needed.

Another alternative is mixing iterative and closed-form solutions within the plan fragments themselves. For example, if a point geometric entity is confined to a one-dimensional locus described by a sixth-degree polynomial, and must be positioned a certain distance from another point, a locally iterative solution can be used to compute the intersection of the locus and a sphere. This is more efficient than employing a general iterative solver in an "outer loop" invoking the entire assembly plan.

Appendix of Functional Algorithms

This appendix describes, at a high level, the algorithms for the major functional components of GCE.

1. Top-level algorithm

The top-level algorithm finds the positions, orientations, and dimensions of all the geoms so that all constraints are satisfied. First, any unary constraints are trivially satisfied; in GCE, these are constraints on the dimension of one geom, so the dimension is adjusted and the dimensional Dot is fixed. Then, chains and loops are solved and rewritten, until the constraint graph has been reduced to a single node.

---

Algorithm 1 (Position Analysis) Algorithm for finding a closed-form solution to a given GCSP, if one exists. Otherwise, the algorithm finds a solution with a minimal number of redundant generalized coordinates, which can then be used by an iterative numerical solver.
Inputs: G, the constraint graph, l, the maximum loop size.
Other variables: loop, a loop that is to be solved.
Output: RGC, a list of any redundant generalized coordinates used.
procedure POSITION-ANALYSIS(G,C,l):
begin
1   RGC ← ∅;
2   Solve all dimensional (i.e., unary) constraints;
3   REPEAT: SOLVE-RIGID-CHAINS(G);
4   if G is a single node
5   then return RGC;
6   L ← IDENTIFY-LOOPS(G,l);
7   if L = ∅
8   then
        begin
9           add a redundant constraint restricting 1 DOF;
10          add corresponding generalized coordinate

---

-continued (the real argument of the redundant constraint) to RGC;
11      goto REPEAT;
        end
12  for l ∈ L do
13      CLASSIFY-LOOP(l);
14      loop ← PICK-LOOP(L);
15      RGC ← RGC + SOLVE-LOOP(loop);
16      goto REPEAT;
    end

---

The PICK-LOOP algorithm is responsible for choosing the best loop to solve, given the choices available. Assuming that SOLVE-RIGID-CHAINS is linear in the number of arcs, a, the complexity of POSITION-ANALYSIS is O(na), where n is the number of nodes in the constraint graph. This results from the fact that, each time the loop in lines 3 through 16 is executed, the size of the constraint graph is decreased by at least one node.

2. Action analysis

In action analysis, some set of constraints C, relating subgeoms on a geom to geoms with invariant attributes, must be satisfied. Action analysis proceeds in the following manner:

---

Algorithm 2 (Action Analysis) Algorithm for using the plan fragment table to perform action analysis.
Inputs: Set of constraints C.
Other variables: c, for temporary storage of a constraint, C', to accumulate a set of constraints (C' is initially empty), MAP, the metaphorical assembly plan.
Outputs: Any constraints that have not been satisfied.
procedure ACTION-ANALYSIS(C):
begin
1   C' ← ∅;
2   while C ≠ ∅ do
    begin
3       choose c ∈ C;
4       C ← C − c;
5       if c matches an entry in the plan fragment table
6       then MAP ← append(MAP,plan fragment)
7       else C' ← C' + c
    end
8   while C' ≠ ∅ do
    begin
9       choose c ∈ C';
10      C' ← C' − c;
11      if c matches an entry in plan fragment table
12      then MAP ← append(MAP,plan fragment)
    end
    return C',
end

---

The time complexity of this algorithm is linear in the size of the initial C. The only constraints that get added to $C^1$ are the ones that do not match anything in the plan fragment table. Any constraints remaining in $C^1$ cannot yet be satisfied with action analysis.

3. Locus analysis

In locus analysis, some set of constraints C, relating subgeoms on partially constrained geoms, needs to be satisfied. Locus analysis proceeds in the following manner:

---

Algorithm 3 (Locus Analysis) Algorithm for using the locus tables to perform locus analysis.
Inputs: Set C of constraints.
Outputs: Set of constraints not reformulated by locus analysis.
Other variables: Set C' (initially empty), Constraint type t,
Geoms $M_1$ and $M_2$, Real variable r.
procedure LOCUS-ANALYSIS(C):

```
begin
1       C' ← ∅;
2       while C ≠ ∅ do
            begin
3               choose c ∈ C;
4               C ← C - c;
5               t ← constraint-type(c);
6               M₁ ← first-geom(c);
7               M₂ ← second-geom(c);
8               if M₁ and M₂ both have loci of ¡ 2
                dimensions
                    and the loci are intersectable
10              then intersect the loci, reformulate c as
                        two constraints relative to the
                        intersection, and solve those two
                        constraints
11              else C' ← C' + c
            end
12      return C';
    end
```

The time complexity of this algorithm is linear in the size of C.

4. Solving chains

Satisfying the constraints on a rigid chain of arbitrary length proceeds recursively by satisfying the constraints between a pair of geoms, and rewriting the pair of geoms as a single macro-geom. The algorithm for identifying a pair of geoms which can be rewritten as a macro-geom, and solving the appropriate constraints is:

Algorithm 4 (Solve Rigid Chains) Algorithm for recognizing and rewriting topologically rigid chains in a constraint graph as macro-geoms.
Inputs: Constraint graph G.
Other variables: I for temporary storage of a geom's invariants record.
procedure SOLVE-RIGID-CHAINS(G):
```
    begin
1       for arc a in the constraint system do
2           if a's constraints imply a rigid connection between
               the geoms
3           then
               begin
4                   g₁ ← one node connected to a
5                   g₂ ← the other node connected to a
6                   if grounded(g₂)
7                   then swap(g₁,g₂)
Comment: At this point, the following encoding has been
established: If one of the geoms is grounded, it is stored in
g₁.
8                   if not grounded(g₁)
9                   then
                       begin
10                          I ← copy-invariants-record(g₁);
11                          ground!(g₁);
                       end
12                  ACTION-ANALYSIS(constraints in a);
13                  Replace g₁,a,g₂ with macro-geom m;
14                  set-invariants-record(m,I);
               end
    end
```

Using this algorithm, all rigid chains in a constraint system can be reformulated in O(a) time, where a is the number of arcs in the graph.

5. Solving loops

Depending on the geometric domain, there is a limit to the size of a loop which can be assembled into a rigid macro-geom. This limit is six geoms for general bodies in 3D space, and three geoms for bodies in 2D space.[1]

[1]Larger loops may be handled by degrees of freedom analysis; however, the absence of any rigid loops implies an iterative solution will be necessary. Defaults will be added to the system until one of tile loops becomes rigid. In this process, rewriting the chains (formed using the defaults) as macro-geoms will reduce the loop size to the limitations specified here.

5.1. Identifying loops

In the algorithm described below, loops are identified in stages. A stage is a list of sequences of node numbers that describe a path through the graph. Sequences in Stage s each contain s+1 nodes. A sequence describes a loop if the first and last numbers in that sequence are equal. To avoid identifying the same loop multiple times (e.g., 8,9,13,8 and 13,8,9,13), a canonical form is required in which the first node number in the loop is the smallest, and the second node number is less than the penultimate one:

Algorithm 5 (Identify Loops) Algorithm for identifying all loops of size l or less in a constraint graph.
Input: G, the constraint graph l, the maximum number of nodes in a loop.
Other variables: Constraint graph connectivity array C, where C[i] contains the list of nodes connected to node i. Stage array (stage[s] contains the sequences in Stage s).
Outputs: The loops found.
procedure IDENTIFY-LOOPS(G,l):
```
    begin
1       C ← make-connectivity-array(G);
2       for i ∈ node numbers do
3           for j in C[i] do
4               if i < j
5               then stage[1] ← staged[1] + i,j
6       for s ← 2 until l do
7           for x₁,x₂,...,xₛ in stage[s − 1] do
8               for j in C[xₛ] do
9                   if xₛ ≠ x₁
10                      and x₁ ≤ j
11                      and ∀ k, 1 < k ≤ s. xₖ ≠ j
12                  then stage[s] ← stage[s] + x₁,x₂,...,xₛ,j
13      loops ← ∅;
14      for s ← 1 until l do
15          for x₁,x₂,...,xₛ₊₁ in stage[s] do
16              if x₁ = xₛ₊₁ and x₂ < xₛ
17              then loops ← loops + x₁,x₂,...,xₛ₊₁
18      return loops;
    end
```

Lines 9 through 11 provide the preconditions for the next node to be a valid continuation of the sequence: the first and last node numbers must not be equal (this would indicate a loop has already been found); the new node number must be greater than the first number; and, the new number must not already be a member of the sequence, unless it matches the first node number, forming a loop. Line 16 checks if a sequence is a canonical description of a loop. In the case where the number of arcs in the graph is comparable to the number of nodes (typical of many GCSP's), the complexity of this algorithm can be shown to be linear in the number of nodes.

5.2. Loop solution preferences The loop identification algorithm often will find several candidate loops for solution. Some of these are more desirable than others. For example, if some loops require redundant generalized coordinates and others do not, the ones that do not are to be preferred. Loops to be solved are picked using the following set of preferences:

$P_1$: Has a grounded geom and is analytically solvable.
$P_2$: Has no grounded geom and is analytically solvable.
$P_3$: Has a grounded geom and is analytically solvable if one additional generalized coordinate is added.
$P_4$: Has no grounded geom and is analytically solvable if one additional generalized coordinate is added.
$P_5$: Has a grounded geom and is analytically solvable if two additional generalized coordinates are added.

P6: Has no grounded geom and is analytically solvable if two additional generalized coordinates are added.
P7: Has a grounded geom and is analytically solvable if three additional generalized coordinates are added.
P8: Has no grounded geom and is analytically solvable if three additional generalized coordinates are added.

Using the above preferences, the following algorithm is used to find the most preferred loop to solve:

---

Algorithm 6 (Pick Loop) Algorithm for choosing a loop from a list of candidates.
Inputs: L, a list of loops, RGC, a list to which redundant generalized coordinates can be added.
Outputs: The most preferred loop.
   procedure PICK-LOOP(L, RGC):
     begin
1      for i ← 1 until 8 do
2        for l ∈ L do
3          if l satisfies $P_i$
4          then
5            begin
6              if redundant generalized coordinates are required
7              then add them to RGC
8              return l;
9            end
     end

---

Since the sequence of preferences ($P_1, \ldots, P_8$) is of fixed length, the time complexity of this algorithm is O(j).

5.3. Solving loops

The constraints in a loop are solved using the following approach: choose a ground node (if one does not exist), and then switch between action and locus analysis until constraints have been satisfied or no further inference is possible:

---

Algorithm 7 (Solve Loop) Algorithm for solving the constraints pertaining to a loop.
Input: Loop L.
Other variables: M a temporary transform matrix.
Output: RGC, a list of any redundant generalized coordinates used.
   procedure SOLVE-LOOP(L):
     begin
1      RGC ← ∅;
2      $g_1$ ← grounded geom of L (or ∅ if no geom is grounded);
3      $g_2$ ← ∅;
4      if $g_1$ = ∅
5      then $g_2$ ← an acceptable ground geom
         (by the kinematic inversion decision procedure)
6      else if $g_1$ is an acceptable ground geom
7        then $g_2$ ← $g_1$
8        else $g_2$ ← an acceptable ground geom
   Comment: At this point, the following encoding has been established: If $g_1$ is null, then no geom on the original loop was grounded. Otherwise, $g_1$ is the original grounded geom, and $g_2$ is the geom being used as ground for the loop solution.
9      if $g_1 \neq$ ∅ and $g_2 \neq g_1$
10     then M ← transform($g_1$)
11     REPEAT: ACTION-ANALYSIS(all constraints in L);
12     LOCUS-ANALYSIS(all constraints in L)
13     if all constraints are satisfied
14     then
         begin
15          rewrite all geoms as macro-geom G;
16          if $g_1 \neq$ ∅ and $g_2 \neq g_1$
17          then move G by inverse(transform($g_2$))·M;
18          return RGC;
         end
19     else if any constraints were satisfied in lines 11 or 12
20     then goto REPEAT
21     else
22       begin
         add a redundant constraint restricting 1 DOF;
23        add corresponding generalized coordinate (the real argument of the redundant constraint) to RGC;
24        goto REPEAT;
       end
   end

---

What is claimed is:

1. In a digital computer having a processor and memory, a method of determining the configuration of a system comprising a collection of geometric entities satisfying a set of constraints, comprising the steps of:
representing the geometric entities in terms of degrees of freedom and storing the geometric entities in memory;
building an assembly plan comprising a plurality of plan fragments using said processor to incrementally satisfy constraints and systematically reduce the degrees of freedom, including the substeps—
using a first plan fragment for a first geometric entity and a first constraint which transforms the geometric entity to a first configuration satisfying the first constraint and reducing at least one degree of freedom,
using other plan fragments for other geometric entities and other constraints satisfying constraints and reducing degrees of freedom;
determining possible configurations of the collection of geometric entities using said assembly plan.

2. The method of claim 1, said representing step including parameterizing geometric entities by a set of configuration variables.

3. The method of claim 2, the geometric entity comprising a rigid body and the configuration variables comprising translational and rotational degrees of freedom.

4. The method of claim 2, the set of configuration variables describing translational, rotational, and dimensional degrees of freedom.

5. The method of claim 1, said representing step comprising creating a data structure having a plurality of invariants.

6. The method of claim 1, said building step including developing a unique plan fragment for each geometric entity and constraint in the system.

7. The method of claim 6, including storing the developed plan fragments as subroutines in computer memory and calling the subroutines for use in building said assembly plan.

8. The method of claim 6, including the substep of organizing in a table the plan fragments for a type of geometric entity with the number of plan fragments corresponding to the number of possible combinations of invariants.

9. The method of claim 1, said building step including repeating the use of the plan fragments until all of the system constraints are satisfied.

10. The method of claim 9, said determining step including identifying a closed form solution if all of the degrees of freedom of the system are reduced to zero.

11. The method of claim 1, said building step including the substeps of grouping a plurality of geometric entities as a subnetwork, solving the subnetwork by temporarily grounding one of the geometric entities and using plan fragments to satisfy the constraints, and reformulating the subnetwork as a single, rigid-body, geometric entity.

12. The method of claim 11, the subnetwork comprising a chain and the solving substep satisfies constraints of respective geometric entities causing the geometric entities to be fixed rigidly with respect to each other.

13. The method of claim 11, the subnetwork comprising a loop and the solving substep satisfying the constraints relating the geometric entities to each other.

14. The method of claim 13, including the substep of identifying the loop with the fewest degrees of freedom and solving the identified loop first.

15. The method of claim 1, including a second geometric entity related to the first geometric entity by a constraint, including the step of determining the locus of possible configurations of at least a portion of the first and second geometric entities as the intersection of the loci of possible configurations for each geometric entity.

16. The method of claim 15, including a third geometric entity related by a constraint to at least one of the first or second geometric entities, including the substep of finding the locus of the third entity in terms of the loci of the first or second geometric entity and known geometric relations.

17. The method of claim 1, including the steps of changing the system by adding, deleting, or altering a constraint, identifying portions of the system affected by the change, and rebuilding an assembly plan only for the affected portions.

18. In a digital computer, having processor means and memory means a method of determining the configuration of a geometric constraint system comprising a collection of geometric entities satisfying a set of constraints, comprising the steps of:

a. storing information in memory means for entities and constraints, said information comprising constraints, geometric entities, and a plurality of plan fragments which each transform a geometric entity to a configuration satisfying a constraint;

b. using said stored information by said processor means to generate an assembly plan for at least partially assembling a computer representation of a configuration of said geometric constraint system;

c. storing said assembly plan in memory means; and d. using said assembly plan by said processor means to at least partially assemble computer representations of one or more configurations of said geometric constraint system.

19. The method of claim 18, wherein the geometric entities are represented in terms of degrees of freedom.

20. The method of claim 19, the representation comprising a data structure having a plurality of invariants.

21. The method of claim 18, including the substep of developing a unique plan fragment for each geometric entity and constraint.

22. The method of claim 18, said using said assembly plan step includes identifying a closed form solution indicative of a single topological configuration.

23. The method of claim 18, said using said assembly plan step includes adding default constraints to the system and assembling a computer representation of a configuration of the system.

24. The method of claim 23, including iteratively varying the default constraints and assembling a configuration until an error function in the plan fragments approaches zero.

25. The method of claim 17, where one or more of the constraints is input to the system in step a., including the step of e. numerically executing the assembly plan, checking for degeneracies, and recording the degrees of freedom of the assembly.

* * * * *